(12) United States Patent
Lee et al.

(10) Patent No.: US 11,664,438 B2
(45) Date of Patent: May 30, 2023

(54) SEMICONDUCTOR STRUCTURE AND METHOD FOR FORMING THE SAME

(71) Applicant: Winbond Electronics Corp., Taichung (TW)

(72) Inventors: Shu-Ming Lee, Taichung (TW); Yung-Han Chiu, Taichung (TW); Chia-Hung Liu, Taichung (TW); Tzu-Ming Ou Yang, Tainan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 6 days.

(21) Appl. No.: 16/674,428

(22) Filed: Nov. 5, 2019

(65) Prior Publication Data

US 2021/0134980 A1    May 6, 2021

(51) Int. Cl.
| | |
|---|---|
| H01L 21/76 | (2006.01) |
| H01L 29/66 | (2006.01) |
| H01L 21/308 | (2006.01) |
| H01L 21/311 | (2006.01) |
| H01L 29/423 | (2006.01) |
| H01L 21/28 | (2006.01) |
| H01L 21/762 | (2006.01) |
| H01L 29/788 | (2006.01) |
| H01L 21/3065 | (2006.01) |

(52) U.S. Cl.
CPC .. *H01L 29/66545* (2013.01); *H01L 21/28114* (2013.01); *H01L 21/3065* (2013.01); *H01L 21/3081* (2013.01); *H01L 21/3086* (2013.01); *H01L 21/31116* (2013.01); *H01L 21/76224* (2013.01); *H01L 29/40114* (2019.08); *H01L 29/42376* (2013.01); *H01L 29/66825* (2013.01); *H01L 29/788* (2013.01)

(58) Field of Classification Search
CPC ......... H01L 21/76224; H01L 29/66545; H01L 21/28114
See application file for complete search history.

(56) References Cited

U.S. PATENT DOCUMENTS

| | | | |
|---|---|---|---|
| 6,368,974 B1 | 4/2002 | Tsai et al. | |
| 6,855,591 B2 * | 2/2005 | Kim | H01L 27/11543 438/296 |

(Continued)

FOREIGN PATENT DOCUMENTS

| | | |
|---|---|---|
| CN | 104103592 A | 10/2014 |
| CN | 104103593 A | 10/2014 |

(Continued)

OTHER PUBLICATIONS

Taiwanese Office Action and Search Report which corresponds to Application No. 108131198; dated Dec. 20, 2019.

*Primary Examiner* — Anthony Ho
*Assistant Examiner* — David J Goodwin
(74) *Attorney, Agent, or Firm* — Muncy, Geissler, Olds & Lowe, P.C.

(57) ABSTRACT

A method for forming a semiconductor structure includes providing a semiconductor substrate, forming a sacrificial layer over the semiconductor substrate, etching the sacrificial layer to form a sacrificial pattern, etching the semiconductor substrate using the sacrificial pattern as an etching mask to form an active region of the semiconductor substrate, trimming the sacrificial pattern, and replacing the trimmed sacrificial pattern with a gate electrode.

18 Claims, 17 Drawing Sheets

(56) References Cited

U.S. PATENT DOCUMENTS

| | | | | |
|---|---|---|---|---|
| 6,927,447 B2* | 8/2005 | Choi | ................. | H01L 27/11521 |
| | | | | 257/374 |
| 7,427,533 B2* | 9/2008 | Lee | ................... | H01L 27/11521 |
| | | | | 438/106 |
| 7,811,935 B2* | 10/2010 | Sandhu | ............. | H01L 27/11526 |
| | | | | 438/672 |
| 7,902,037 B2* | 3/2011 | Eun | ..................... | H01L 27/1052 |
| | | | | 438/296 |
| 8,163,627 B2* | 4/2012 | Kim | ................. | H01L 21/76232 |
| | | | | 257/499 |
| 8,211,767 B2 | 7/2012 | Yaegashi | | |
| 8,921,913 B1 | 12/2014 | Hsu et al. | | |
| 9,129,911 B2 | 9/2015 | Doan et al. | | |
| 2002/0072197 A1* | 6/2002 | Kang | ............. | H01L 21/823481 |
| | | | | 257/E21.549 |
| 2004/0157457 A1 | 8/2004 | Xu et al. | | |
| 2005/0258463 A1* | 11/2005 | Yaegashi | ........... | H01L 27/11524 |
| | | | | 257/296 |
| 2005/0287731 A1* | 12/2005 | Bian | ................ | H01L 29/42324 |
| | | | | 438/257 |
| 2006/0286713 A1* | 12/2006 | Lee | ................... | H01L 27/11521 |
| | | | | 438/106 |
| 2008/0237685 A1* | 10/2008 | Cho | ................. | H01L 29/40114 |
| | | | | 438/266 |
| 2009/0243050 A1* | 10/2009 | Eun | ..................... | H01L 27/1052 |
| | | | | 257/647 |

FOREIGN PATENT DOCUMENTS

| | | |
|---|---|---|
| CN | 105097704 A | 11/2015 |
| KR | 2005-0010236 A1 | 1/2005 |

\* cited by examiner

SEMICONDUCTOR STRUCTURE AND METHOD FOR FORMING THE SAME

BACKGROUND

Field of the Disclosure

The present disclosure relates to a semiconductor structure, and in particular, it relates to a flash memory.

Description of the Related Art

For the past few years, flash memory has become the mainstream of nonvolatile memory devices. Its advantages include high density, low cost, and being rewritable and electrically-erasable. Also, flash memory is commonly applied in various portable electronic products such as notebook computers, MP3 players, digital cameras, mobile phones, and game consoles.

With the shrinkage of the memory manufacturing processes, general manufacturing processes of flash memory have the following problems. A void may be formed in a floating gate. The void in the floating gate may reduce the reliability and manufacturing yield of the memory device. Therefore, how to provide a method for forming a flash memory to reduce the likelihood of the formation of a void in the floating gate is an important issue.

SUMMARY

In some embodiments of the disclosure, a method for forming a semiconductor structure is provided. The method providing a semiconductor substrate, forming a sacrificial layer over the semiconductor substrate, etching the sacrificial layer to form a sacrificial pattern, etching the semiconductor substrate using the sacrificial pattern as an etching mask to form an active region of the semiconductor substrate, trimming the sacrificial pattern, and replacing the trimmed sacrificial pattern with a gate electrode.

In some embodiments of the disclosure, a semiconductor structure is provided. The semiconductor structure includes an active region of a semiconductor substrate, a gate electrode disposed over the active region and an isolation structure. The gate electrode includes a lower portion and an upper portion. The width of the upper portion is greater than the width of the lower portion. The active region and the gate electrode are embedded in the isolation structure. The isolation structure includes a first insulating material and a second insulating material disposed over the first insulating material.

BRIEF DESCRIPTION OF THE DRAWINGS

The present disclosure can be further understood by reading the subsequent detailed description and examples with references made to the accompanying drawings, wherein:

FIG. 1D-1 is a portion of the cross-sectional view of FIG. 1D to illustrate additional details in accordance with some embodiments of the present disclosure.

FIG. 1L-1 is a portion of the cross-sectional view of FIG. 1L to illustrate additional details in accordance with some embodiments of the present disclosure.

FIG. 2D-1 is a portion of the cross-sectional view of FIG. 2D to illustrate additional details in accordance with some embodiments of the present disclosure.

FIG. 2L-1 is a portion of the cross-sectional view of FIG. 2L to illustrate additional details in accordance with some embodiments of the present disclosure.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 1A:
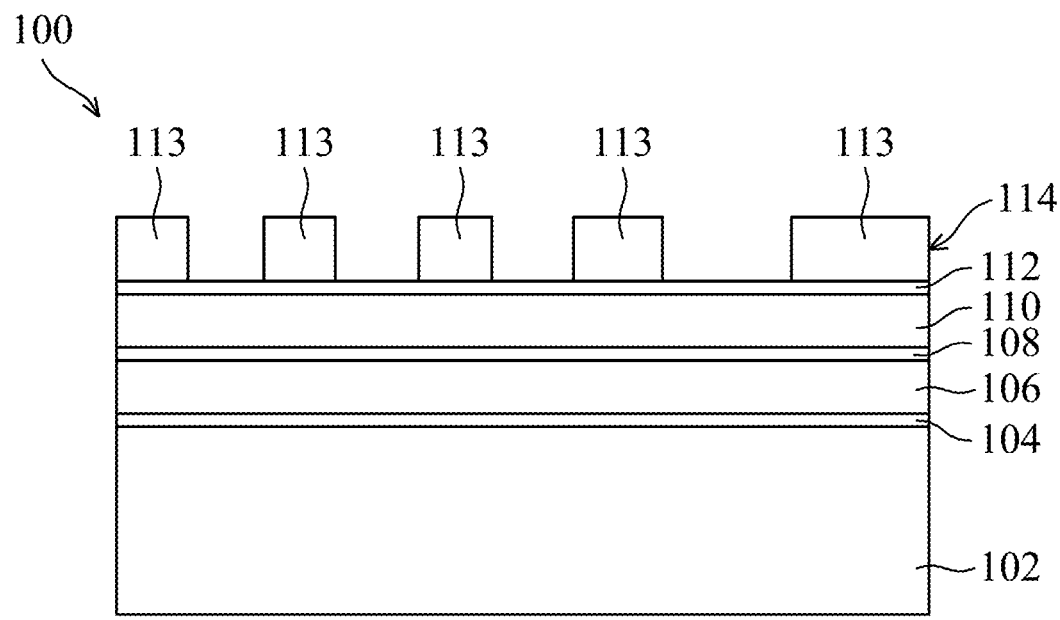
FIGS. 1A-1L illustrate cross-sectional views of forming a semiconductor structure at various stages in accordance with some embodiments of the present disclosure.

FIGS. 1A-1L illustrate cross-sectional views of forming a semiconductor structure at various stages in accordance with some embodiments of the present disclosure. A semiconductor structure 100 is provided, as shown in FIG. 1A, in accordance with some embodiments. The semiconductor structure 100 includes a semiconductor structure 102, in accordance with some embodiments. In some embodiments, the semiconductor substrate 102 is an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

A gate dielectric layer 104, a sacrificial layer 106, a first hard mask layer 108, a second hard mask layer 110, an anti-reflective layer 112 are sequentially formed over the semiconductor substrate 102, as shown in FIG. 1A, in accordance with some embodiments.

In some embodiments, the gate dielectric layer 104 is made of silicon oxide (SiO), silicon nitride (SiN), or silicon oxynitride (SiON). In some embodiments, the gate dielectric layer 104 is formed using in situ steam generation (ISSG), thermal oxidation, a chemical vapor deposition (CVD) process, or a combination thereof.

In some embodiments, the sacrificial layer 106 and the second hard mask layer 110 are made of a carbon-rich material such as carbon (e.g., amorphous carbon, spin-on coating carbon (SOC), or a combination thereof). In some embodiments, the sacrificial layer 106 and the second hard mask layer 110 are formed using a spin-on coating process, a CVD process, an atomic layer deposition (ALD) process, or a combination thereof.

In some embodiments, the first hard mask layer 108 and the anti-reflective layer 112 are made of silicon-rich material such as silicon-rich anti-reflective layer (Si-BARC), silicon oxynitride (SiON), or a combination thereof. In some embodiments, the first hard mask layer 108 and the anti-reflective layer 112 are formed using a CVD process, an ALD process, or a combination thereof.

In some embodiments, the sacrificial layer 106 is a carbon layer; the first hard mask layer 108 is a silicon oxynitride (SiON) layer; the second hard mask layer 110 is a SOC layer; and the anti-reflective layer 112 is a Si-BARC layer.

A patterning process is performed on the semiconductor structure 100, in accordance with some embodiments. The patterning process includes forming a patterned photoresist layer 114 over the anti-reflective layer 112, as shown in FIG. 1A, in accordance with some embodiments. The patterned photoresist layer 114 includes multiple photoresist patterns 113 which partially cover an upper surface of the anti-reflective layer 112, in accordance with some embodiments.

Figure 1B:
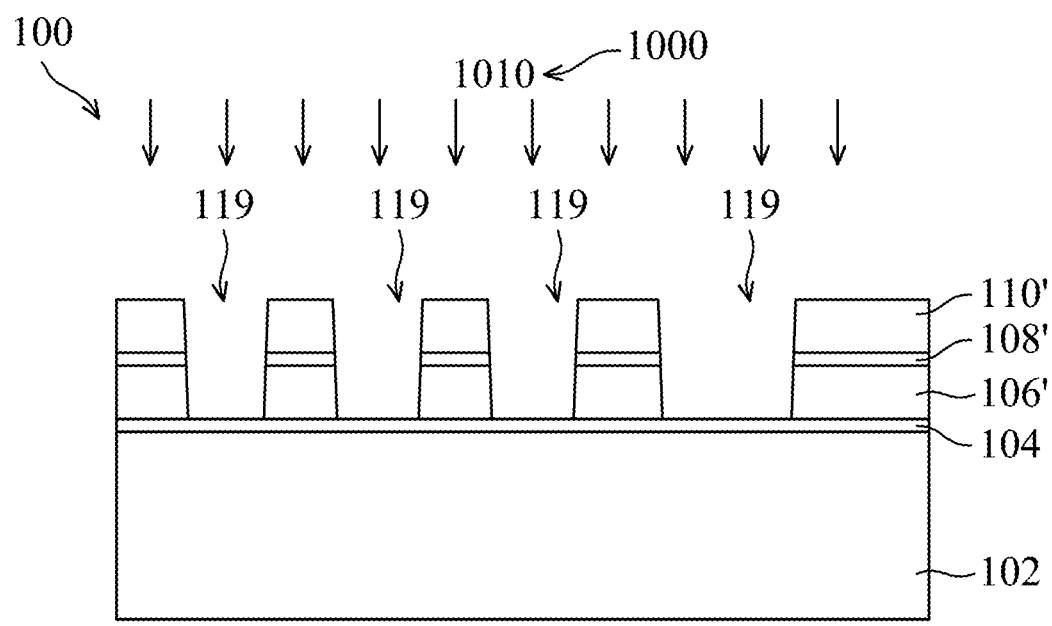
Figure 1C:
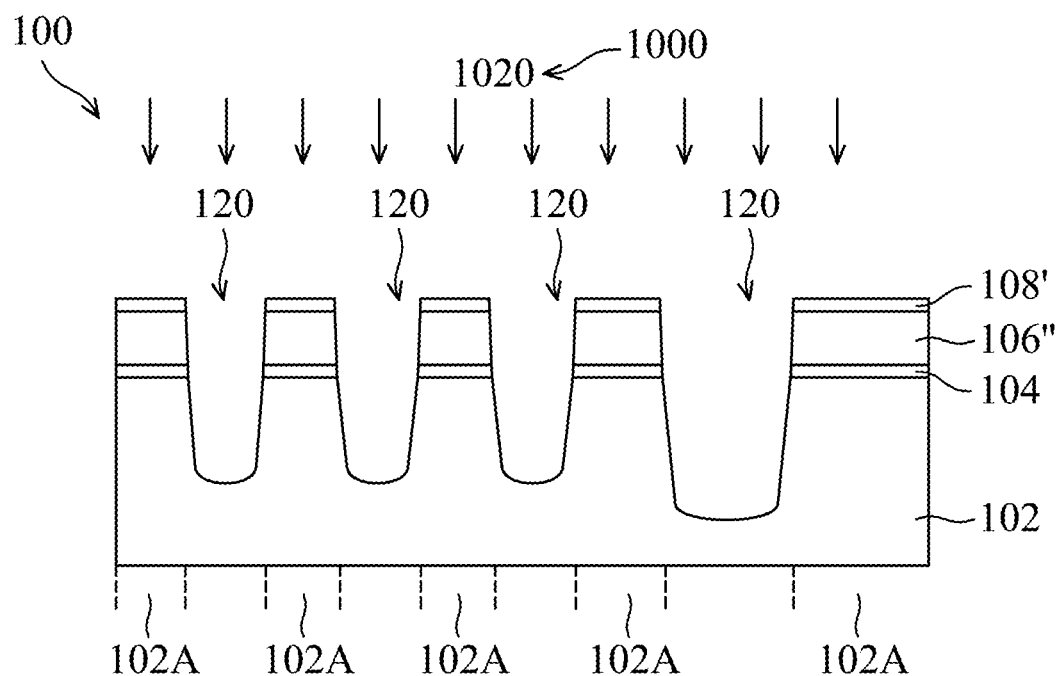
Figure 1D:
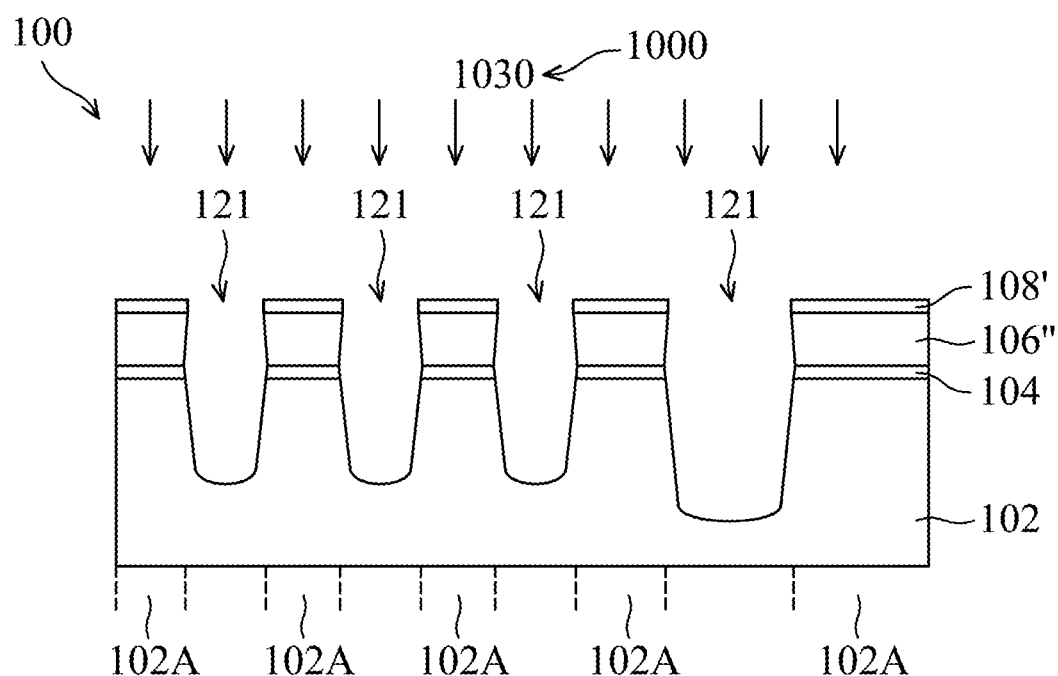

The patterning process also includes performing an etching process 1000 on the semiconductor structure 100, as shown in FIGS. 1B-1D, in accordance with some embodiments. In some embodiments, the etching process 1000 includes multiple etching steps for various material layers.

An etching step 1010 of the etching process 1000 is performed on the semiconductor structure 100 to sequentially etch away portions of the anti-reflective layer 112, the second hard mask layer 110, the first hard mask layer 108 and the sacrificial layer 106 uncovered by the photoresist patterns 113, as shown in FIG. 1B, in accordance with some embodiments. The etching step 1010 transfers the photoresist patterns 113 sequentially to the anti-reflective layer 112, the second hard mask layer 110, the first hard mask layer 108 and the sacrificial layer 106 and forms trenches 119, in accordance with some embodiments.

In some embodiments, the photoresist layer 114 is entirely consumed during the etching of the second hard mask layer 110. In some embodiments, the anti-reflective layer 112 is entirely consumed during the etching of the first hard mask layer 108. The patterned second hard mask layer 110, the patterned first hard mask layer 108 and the patterned sacrificial layer 106 are referred to as second hard mask patterns 110', first hard mask patterns 108' and sacrificial patterns 106' respectively, in accordance with some embodiments.

In some embodiments, an etching gas (such as oxygen ($O_2$) and/or carbon oxide (CO)) and a passivation gas (such as carbonyl sulfide (COS), sulfur oxide ($SO_2$), and/or nitrogen) are introduced in the step of etching the sacrificial layer 106. In some embodiments, the ratio of the flow rate of the etching gas to the flow rate of the passivation gas in the step of etching the sacrificial layer 106 is a first ratio that is in a range from about 0.2 to about 0.8.

An etching step 1020 of the etching process 1000 is performed on the semiconductor structure 100 to sequentially etch away portions of the gate dielectric layer 104 and the semiconductor substrate 102 uncovered by the sacrificial patterns 106', as shown in FIG. 1C, in accordance with some embodiments. The etching step 1020 uses the sacrificial patterns 106' as an etching mask to transfer the sacrificial patterns 106' sequentially to the gate dielectric layer 104 and the semiconductor substrate 102. The trenches 119 extend into the semiconductor substrate 102 and are referred to as trenches 120, in accordance with some embodiments. The trenches 120 define active regions 102A of the semiconductor substrate 102, in accordance with some embodiments. In some embodiments, the second hard patterns 110' are entirely consumed during the etching of the semiconductor substrate 102 thereby exposing the first hard mask patterns 108'.

An etching step 1030 of the etching process 1000 is performed on the semiconductor structure 100 to trim the sacrificial patterns 106', as shown in FIG. 1D, in accordance with some embodiments. The sacrificial patterns 106' are laterally etched during the etching step 1030 so that the trenches 120 expand laterally at the sacrificial patterns 106', in accordance with some embodiments. The trimmed sacrificial patterns 106' are labeled as sacrificial patterns 106" and the expanded trenches 120 are labeled as trenches 121. In some embodiments, the etching step 1030 does not remove or merely removes a small amount of silicon-containing material, such as the first hard mask patterns 108', the gate dielectric layers 104 and the semiconductor substrate 102. In some embodiments, the multiple etching steps 1010-1030 are performed in situ with the same etching tool.

In some embodiments, an etching gas (such as oxygen ($O_2$) and/or carbon oxide (CO)) and a passivation gas (such as carbonyl sulfide (COS), sulfur oxide ($SO_2$), and/or nitrogen) are introduced in the etching step 1030 of trimming the sacrificial patterns 106'. In some embodiments, the ratio of the flow rate of the etching gas to the flow rate of the passivation gas in the etching step 1030 is a second ratio that is in a range from about 0.05 to about 0.5. The second ratio of the etching step 1030 of trimming the sacrificial patterns 106' is less than the first ratio of the step of etching the sacrificial layer 106 (i.e., the etching step 1030 introduces less oxygen) so that an etching amount of lower portions of the sacrificial patterns 106' proximate to the semiconductor substrate 102 is greater than an etching amount of the upper portions of the sacrificial patterns 106' proximate to the first hard mask patterns 108', in accordance with some embodiments.

Figures 1, 1D:
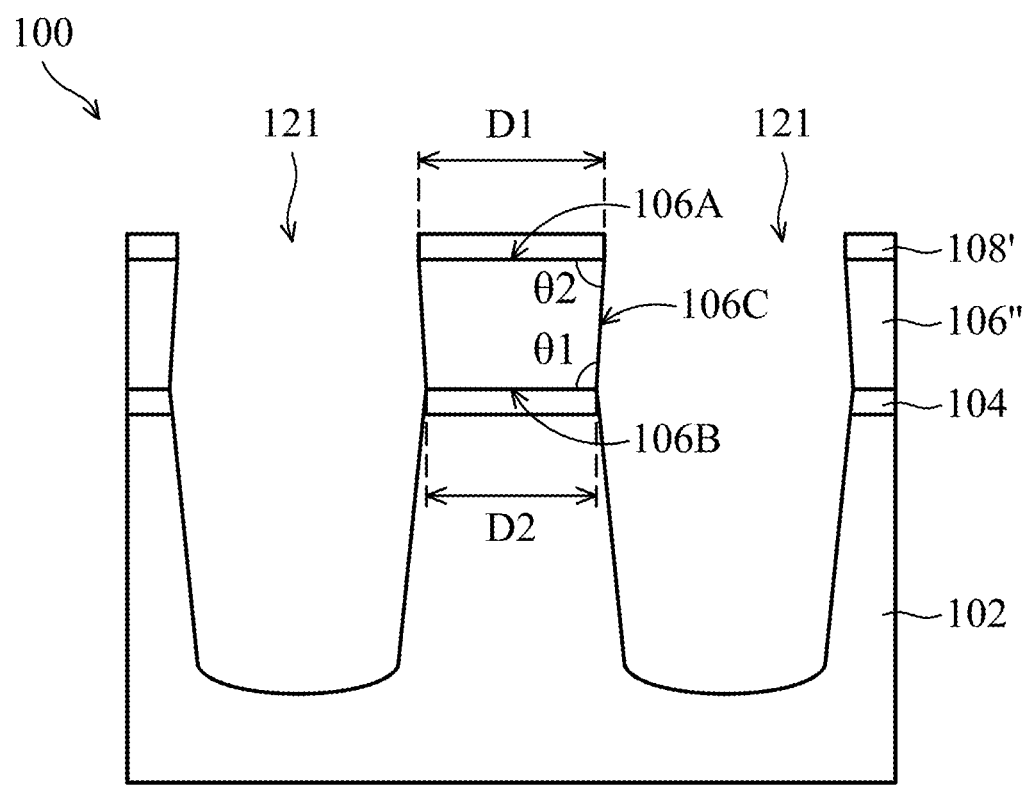

FIG. 1D-1 is a portion of the cross-sectional view of FIG. 1D to illustrate additional details in accordance with some embodiments of the present disclosure. In some embodiments, the trimmed sacrificial pattern 106" has a trapezoidal profile that tapers downward. In some embodiments, the trimmed sacrificial pattern 106" has a top surface 106A, a bottom surface 106B, and sidewalls 106C. In some embodiments, a width D1 of the top surface 106A is greater than a width D2 of the bottom surface 106B. In some embodiments, an angle θ1 between the sidewall 106C and the bottom surface 106B is an obtuse angle while an angle θ2 between the sidewall 106C and the top surface 106A is an acute angle.

Figure 1E:
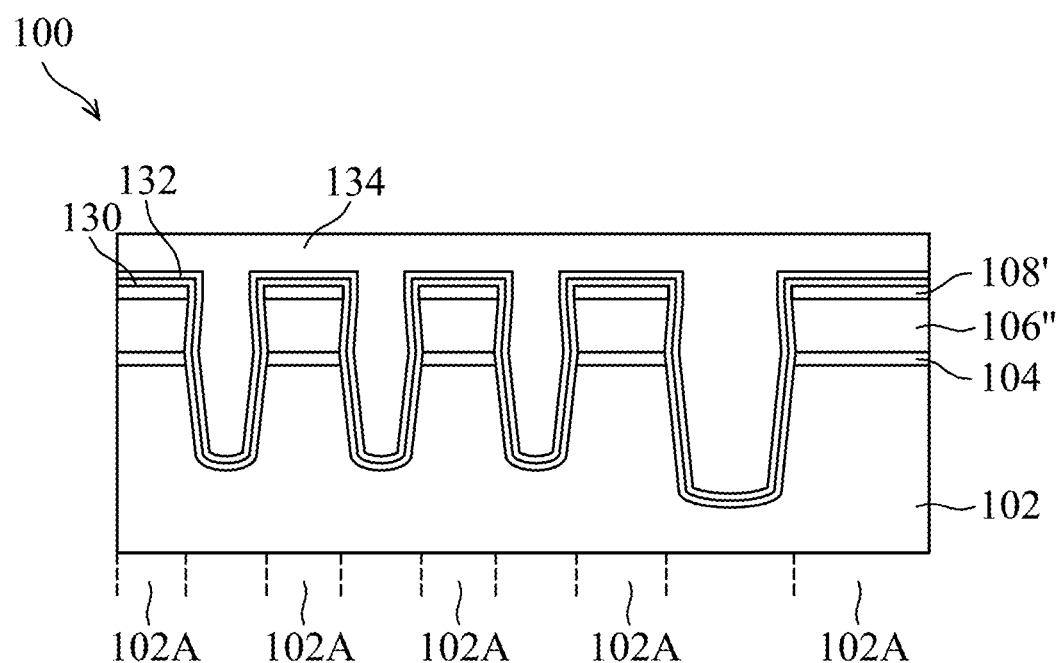

A first lining layer 130 is conformally formed over the semiconductor structure 100, as shown in FIG. 1E, in accordance with some embodiments. The first lining layer 130 is configured to restore the surfaces which are damaged by the etching process 1000 so that the resulting semiconductor device may have lower leak current and to advantageously adhere an insulating material subsequently formed in the trenches to the active regions 102A of the semiconductor substrate 102, in accordance with some embodiments. The first lining layer 130 extends conformally along and covers the sidewalls (i.e., the sidewalls of the first hard mask pattern 108', the sacrificial patterns 106", the gate dielectric layer 104 and the active regions 102A of the semiconductor substrate 102) and the bottom surface of the trenches 121, in accordance with some embodiments. The first lining layer 130 also extends along and covers the upper surfaces of the first hard mask patterns 108', in accordance with some embodiments.

In some embodiments, the first lining layer 130 is an oxide layer such as silicon oxide (SiO). In some embodiments, the first lining layer 130 is formed using ISSG, a thermal oxidation process, a CVD process, an ALD process, or a combination thereof.

A second lining layer 132 is formed over the first lining layer 130, as shown in FIG. 1E, in accordance with some embodiments. The second lining layer is configured as a stop layer for a following removal process, in accordance with some embodiments. The first lining layer 130 and the second lining layer 132 partially fill the trenches 121, in accordance with some embodiments.

In some embodiments, the second lining layer 132 is a nitride layer such as silicon nitride (SiN). In some embodiments, the second lining layer 132 is formed using a CVD process, an ALD process, or a combination thereof.

A first insulating material 134 is formed over the second lining layer 132, as shown in FIG. 1E, in accordance with some embodiments. The first insulating material 134 is filled in a remainder of the trenches 121, in accordance with some embodiments.

In some embodiments, the first insulating material 134 is silicon oxide, silicon nitride, or silicon oxynitride. In some embodiments, the first insulating material 134 is spin-on-glass (SOG). In some embodiments, SOG is deposited using a spin-on coating process to till the trenches 121 and cover the upper surface of the second lining layer 132. In some embodiments, SOG is planarized using an anneal process. Afterward, a portion of the first insulating material 134 over the upper surface of the second lining layer 132 is removed using such as chemical mechanical polish (CMP) until the second lining layer 132 is exposed. In some embodiments, the second lining layer 132 is configured as the polishing stop layer for the removal process.

Figure 1F:
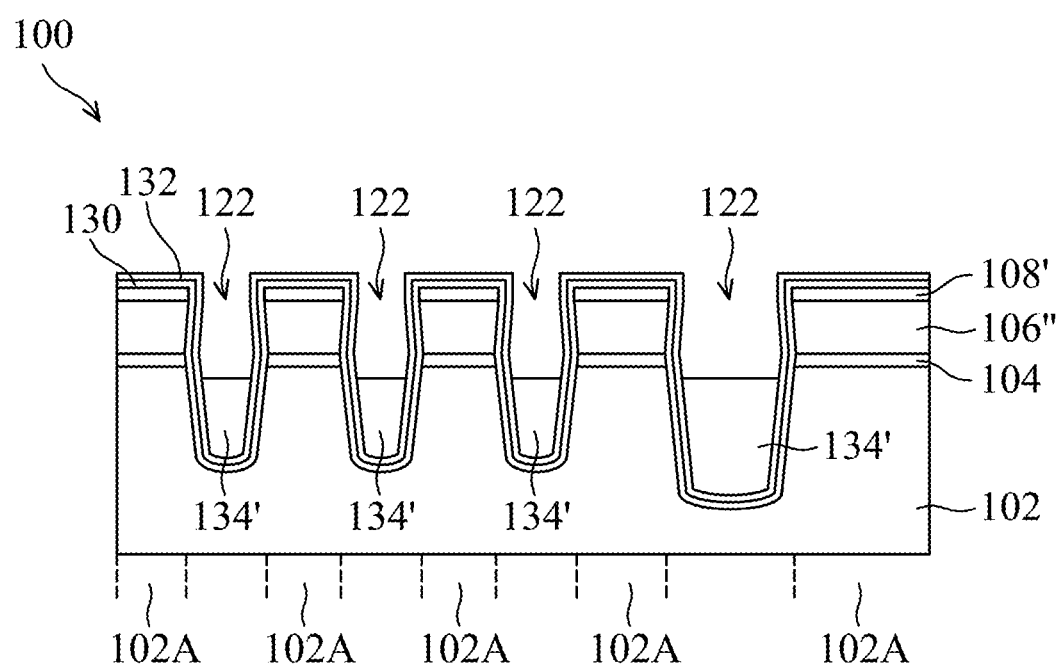

The first insulating material 134 is recessed to form trenches 122, as shown in FIG. 1F, in accordance with some embodiments. The recessed first insulating material 134 is labeled as a first insulating material 134', in accordance with some embodiments. The first insulating material 134' has a top surface below the upper surface of the active region 104A of the semiconductor substrate 102, in accordance with some embodiments. The recess process is an etching process such as dry etching or wet etching, in accordance with some embodiments.

Figure 1G:
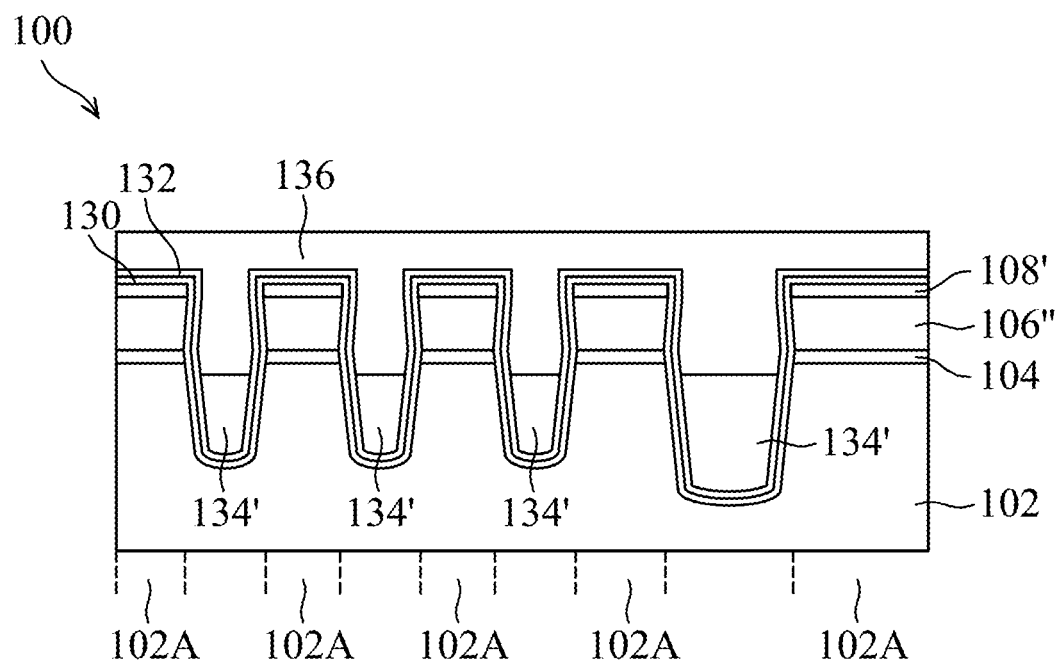

A second insulating material 136 is formed to fill the trenches 122, as shown in FIG. 1G, in accordance with some embodiments. The second insulating material 136 covers the upper surface of the second lining layer 132, in accordance with some embodiments.

In some embodiments, the second insulating material 136 is silicon oxide, silicon nitride, or silicon oxynitride. In some embodiments, the second insulating material 136 is formed using a high-density plasma CVD (HDP-CVD) process. In some embodiments, the lower portion of the trench 121 (FIG. 1D) is filled with SOC and the upper portion of the trench 121 (i.e., the trench 122) is filled with HDP-CVD oxide because SOG has the better gap-fill capability and the HDP-CVD oxide has the better isolation capability.

Figure 1H:
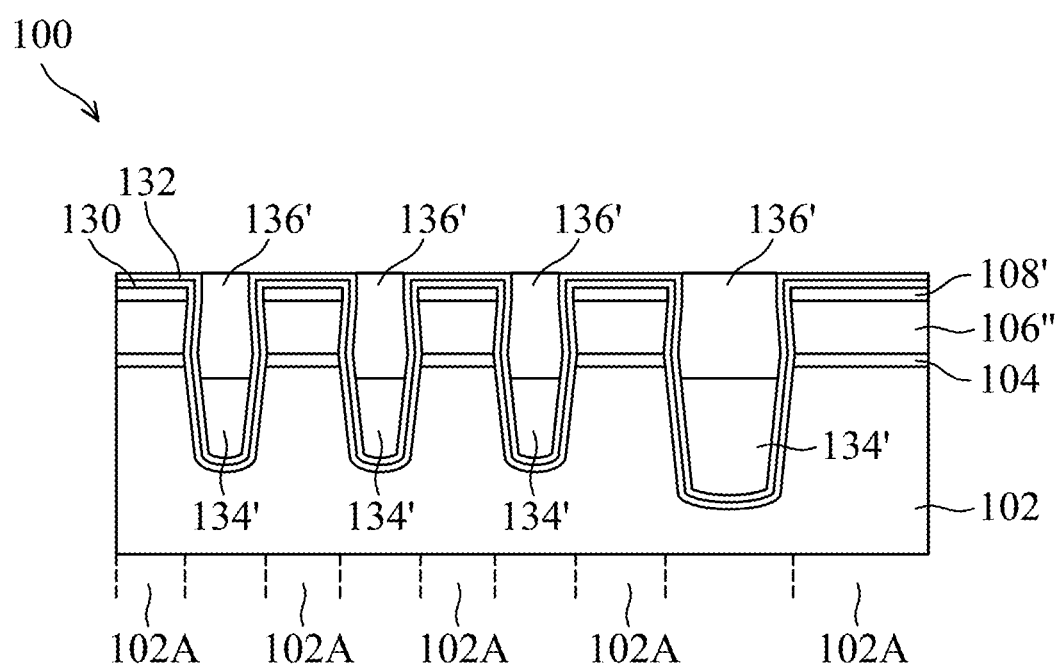

In some embodiments, a portion of the second insulating material 136 over the upper surface of the second lining layer 132 is removed using such as CMP until the second lining layer 132 is exposed, as shown in FIG. 1H, in accordance with some embodiments. In some embodiments, the second lining layer 132 is configured as the polishing stop layer for the removal process. The second insulating material 136 after being polished is labeled as a second insulating material 136', in accordance with some embodiments.

Figure 1I:
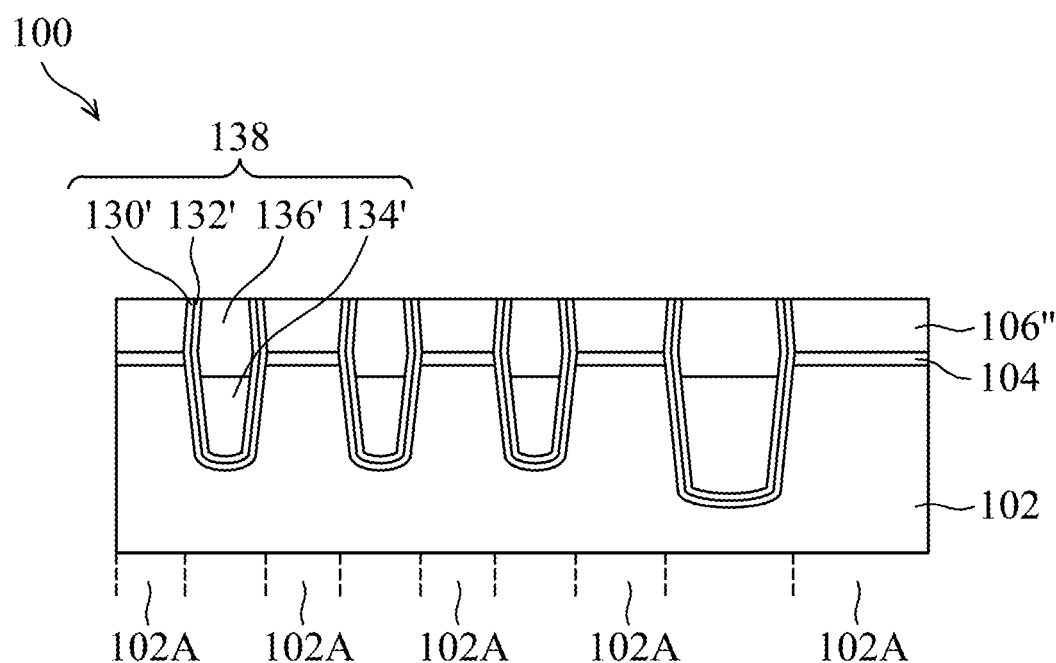

An etching-back process is performed on the semiconductor structure 100, in accordance with some embodiments. The etching-back process removes the second lining layer 132, the first lining layer 130 and the first hard mask patterns 108' over the upper surfaces of the sacrificial patterns 106" until the upper surfaces of the sacrificial patterns 106" are exposed, as shown in FIG. 1I, in accordance with some embodiments. The remaining portions of first lining layer 130 and the second lining layer 132 are labeled as the first lining layer 130' and the second lining layer 132', in accordance with some embodiments. The etching-back process may also remove a small amount of material of second insulating material 136'. The first lining layer 130', the second lining layer 132', the first insulating material 134' and the second insulating material 136' combine to form an isolation structure 138, in accordance with some embodiments. In some embodiments, the etching-back process includes dry etching or wet etching.

Figure 1J:
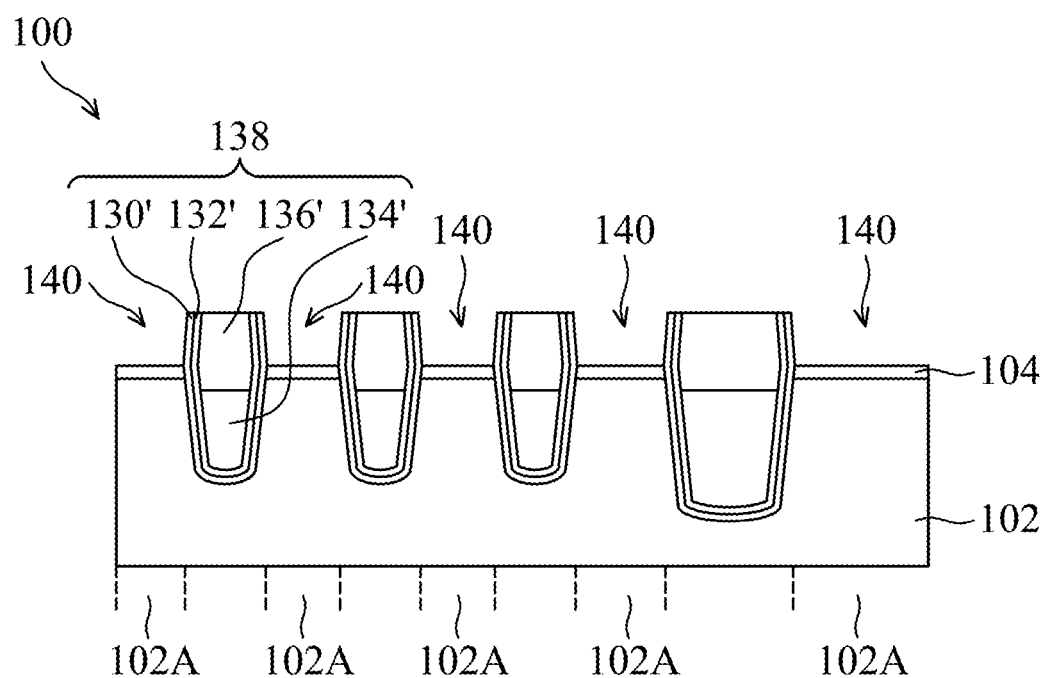

The sacrificial patterns 106" are replaced with gate electrodes, in accordance with some embodiments. The replacement process includes removing the sacrificial patterns 106" to form openings 140, as shown in FIG. 1J, in accordance with some embodiments. The openings 140 expose the gate dielectric layer 104 and the first lining layer 130' of the isolation structure 138, in accordance with some embodiments. In some embodiments, the removal process includes an ash process. A post-clean process may be performed on the semiconductor structure 100 after the sacrificial patterns 106" are removed. The opening 140, formed by removing the sacrificial pattern 106", has a trapezoidal profile that tapers downward, in accordance with some embodiments. A width of the top surface of the opening 140 is greater than the width of the bottom surface of the opening 140, in accordance with some embodiments.

Figure 1K:
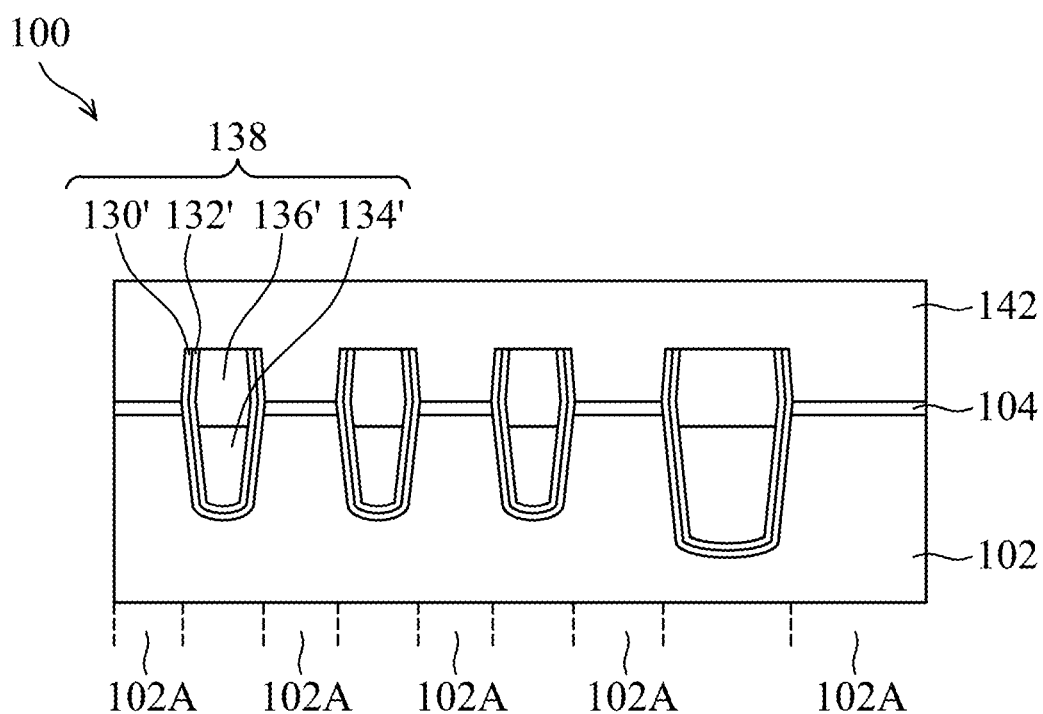

The replacement process includes forming a conductive material 142 over the semiconductor structure 100, as shown in FIG. 1K, in accordance with some embodiments. The conductive material 142 fills the openings 140 and covers the upper surface of the isolation structure 138, in accordance with some embodiments.

In some embodiments, the conductive material 142 is polysilicon, metal or metal nitride. In some embodiments, the metal may be tungsten (W), titanium (Ti), aluminum (Al), copper (Cu), molybdenum (Mo), nickel (Ni), platinum (Pt), or a combination thereof. In some embodiments, the conductive material 142 is formed using a CVD process, a physical vapor deposition (PVD process, or a combination thereof.

Because the top surface of the opening 140 is wider than the bottom surface of the opening 140, the likelihood of the formation of a void inside the conductive material 142 in the openings 140 may be reduced during filling the conductive material 142 into the openings 140. Therefore, the reliability and the manufacturing yield of the resulting semiconductor device may be increased.

Figure 1L:
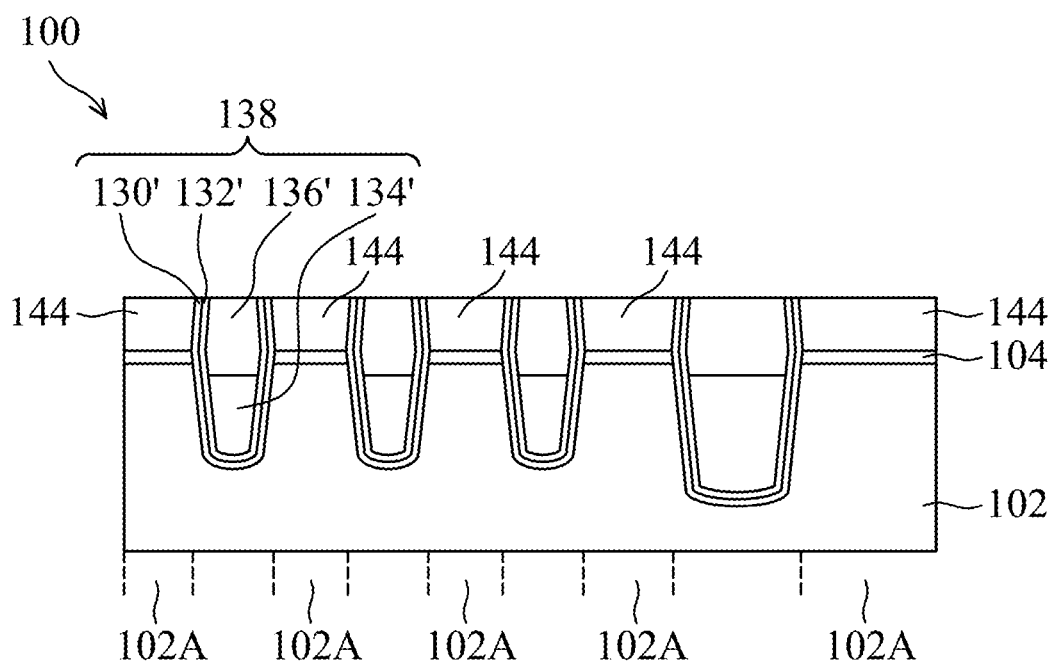
Figures 1, 1L:
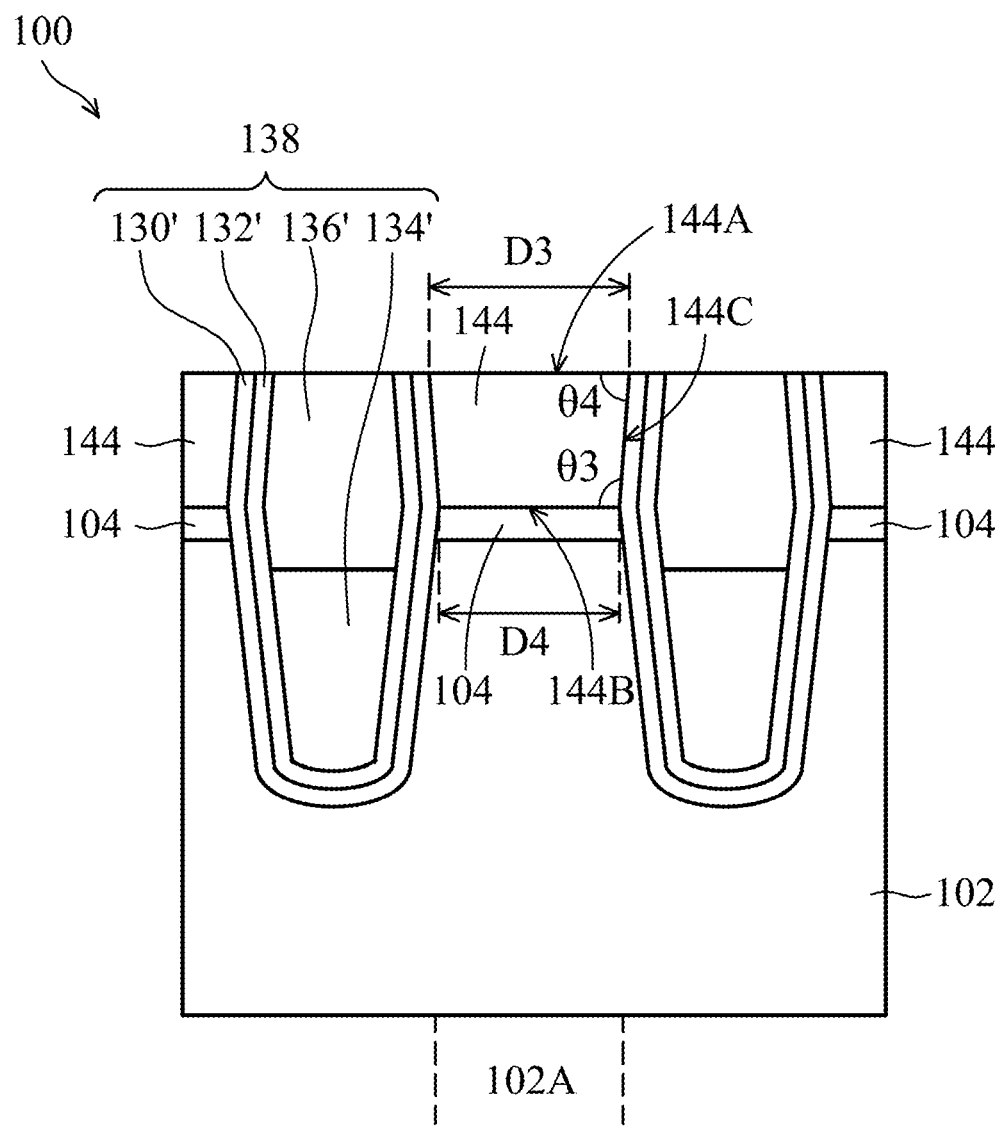

The replacement process includes removing a portion of the conductive material 142 over the upper surface of the isolation structure 138 until the upper surface of the isolation structure 138 is exposed, as shown in FIG. 1L, in accordance with some embodiments. In some embodiments, the removal process is a CMP process. Remaining portions of the conductive material 142 in the openings 140 serve as the gate electrodes 144, in accordance with some embodiments. The top surface of the gate electrode 144 is coplanar with the top surface of the isolation structure 138. In some embodiments, the gate electrode 144 and the gate dielectric layer 104 combine to form a gate structure of a semiconductor device which engages a channel region in the active region 102A of the semiconductor substrate 102.

FIG. 1L-1 is a portion of the cross-sectional view of FIG. 1L to illustrate additional details in accordance with some embodiments of the present disclosure. In some embodiments, the gate electrode 144 has a trapezoidal profile that tapers downward. In some embodiments, the gate electrode 144 has a top surface 144A, a bottom surface 144B, and sidewalls 144C. In some embodiments, a width D3 of the top surface 144A is greater than a width D4 of the bottom surface 144B. In some embodiments, an angle θ3 between the sidewall 144C and the bottom surface 144B is an obtuse angle while an angle θ4 between the sidewall 144C and the top surface 144A is an acute angle.

The gate structure (including the gate electrode 144 and the gate dielectric layer 104) and the active region 102A of the semiconductor substrate 102 are embedded in the isolation structure 138, in accordance with some embodiments. The first lining layer 130' and the second lining layer 132' of the isolation structure 138 line on the gate structure (including the gate electrode 144 and the gate dielectric layer 104) and the sidewalls of the active region 102A of the semiconductor substrate 102 and surround the first insulating material 134' and the second insulating material 136' of the isolation structure 138, in accordance with some embodiments.

In some embodiments, additional components may be formed over the semiconductor structure 100 to produce a semiconductor memory such as flash memory. In some embodiments, the gate electrode 144 may serve as the floating gate of flash memory.

Figure 2A:
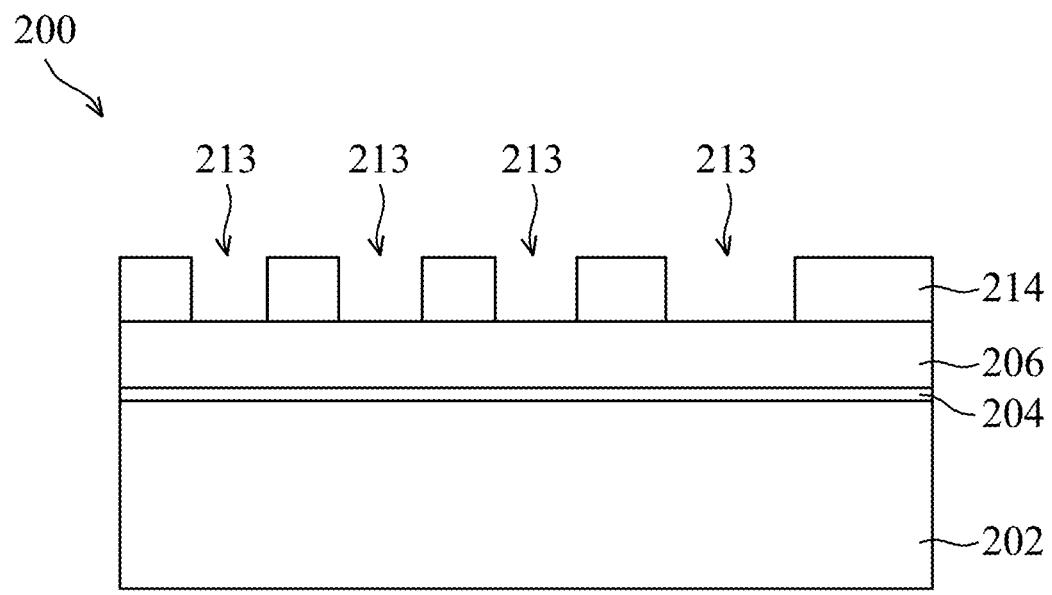
FIGS. 2A-2L illustrate cross-sectional views of forming a semiconductor structure at various stages in accordance with some embodiments of the present disclosure.

FIGS. 2A-2L illustrate cross-sectional views of forming a semiconductor structure at various stages in accordance with some embodiments of the present disclosure. A semiconductor structure 200 is provided, as shown in FIG. 2A, in accordance with some embodiments. The semiconductor structure 200 includes a semiconductor substrate 202 which is the same as or similar to the semiconductor substrate 102, in accordance with some embodiments.

A gate dielectric layer 204 and a sacrificial layer 206 are sequentially formed over the semiconductor substrate 202, as shown in FIG. 2A, in accordance with some embodiments. In some embodiments, the material and the formation method of the gate dielectric layer 204 are the same as or similar to the gate dielectric layer 104. In some embodiments, the sacrificial layer 206 is made of a dielectric material such as nitride such as silicon nitride (SiN). In some embodiments, the sacrificial layer 206 is formed using a CVD process, an ALD process, or a combination thereof.

A patterning process is performed on the semiconductor substructure 200, in accordance with some embodiments. The patterning process includes forming a patterned photoresist layer 214 over the sacrificial layer 206, as shown in FIG. 1A, in accordance with some embodiments. The patterned photoresist layer 214 includes multiple photoresist patterns 213 which partially cover the upper surface of the sacrificial layer 206, in accordance with some embodiments.

Figure 2B:
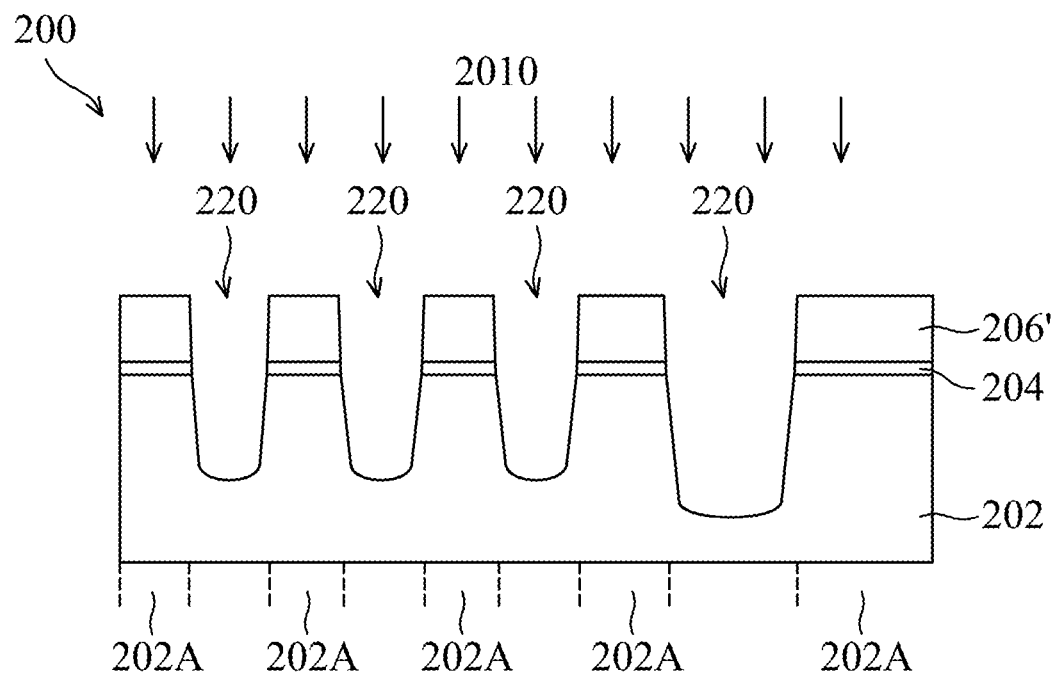
Figure 2C:
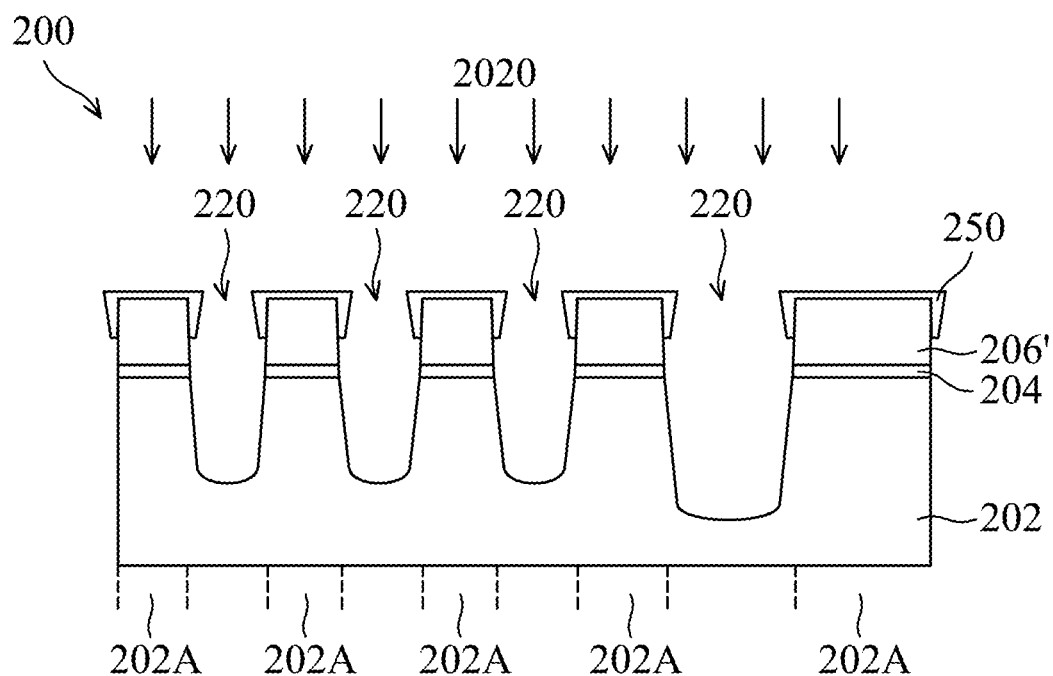

The patterning process also includes performing an etching step 2010 and a deposition step 2020, as shown in FIGS. 2B and 2C, in accordance with some embodiments.

The etching step 2010 is performed on the semiconductor structure 200 to sequentially etch away the portions of the sacrificial layer 206, the gate dielectric layer 204 and the semiconductor substrate 202 uncovered by the photoresist patterns 213, as shown in FIG. 2B. In some embodiments, the etching step 2010 transfers the photoresist patterns 213 sequentially to the sacrificial layer 206, the gate dielectric layer 204 and the semiconductor substrate 202 to form trenches 220, in accordance with some embodiments. The trenches define active regions 204A of the semiconductor substrate 202, in accordance with some embodiments.

The patterned sacrificial layer 206 is referred to as sacrificial patterns 206', in accordance with some embodiments. In some embodiments, the patterned photoresist layer 214 is entirely consumed during the etching of the gate dielectric layer 204 thereby exposing the sacrificial patterns 206'.

A deposition step 2020 is performed on the semiconductor structure 200 to form a protection layer 250, as shown in FIG. 2C, in accordance with some embodiments. The protection layer 250 covers upper portions of the sacrificial patterns 206' while lower portions of the sacrificial patterns 206' are exposed, in accordance with some embodiments. In some embodiment, the etching step 2010 and the deposition step 2020 are performed in situ with the same etching tool.

In some embodiments, the protection layer 250 is made of polymer. In some embodiments, a precursor with a carbon-hydrogen bond (such as $C_xH_y$) is introduced in the deposition step 2020 and the precursor is polymerized to deposit the protection layer 250 over the sacrificial patterns 206', in accordance with some embodiments. In some embodiments, the polymer is deposited to entirely cover the top surfaces and the sidewalls of the sacrificial patterns 206'. Afterward, the polymer is etched to expose the lower portions of the sidewalls of the sacrificial patterns 206' while remaining the upper portion of sidewalls of the sacrificial patterns 206' covered by a remainder of the polymer (i.e., the protection layer 210), in accordance with some embodiments.

Figure 2D:
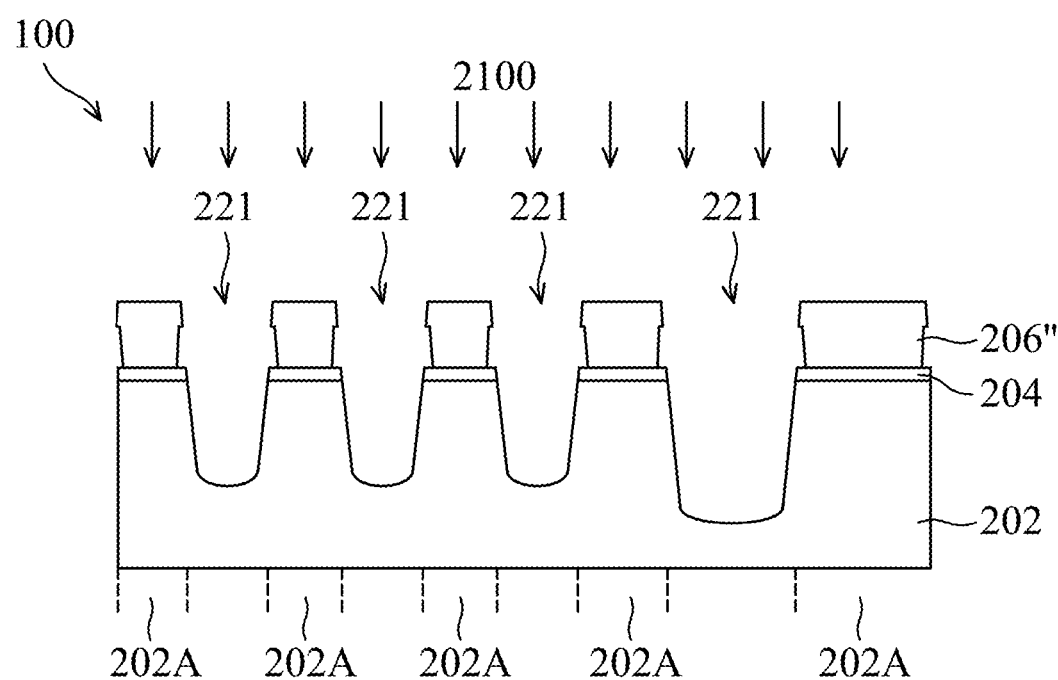
Figures 1, 2D:
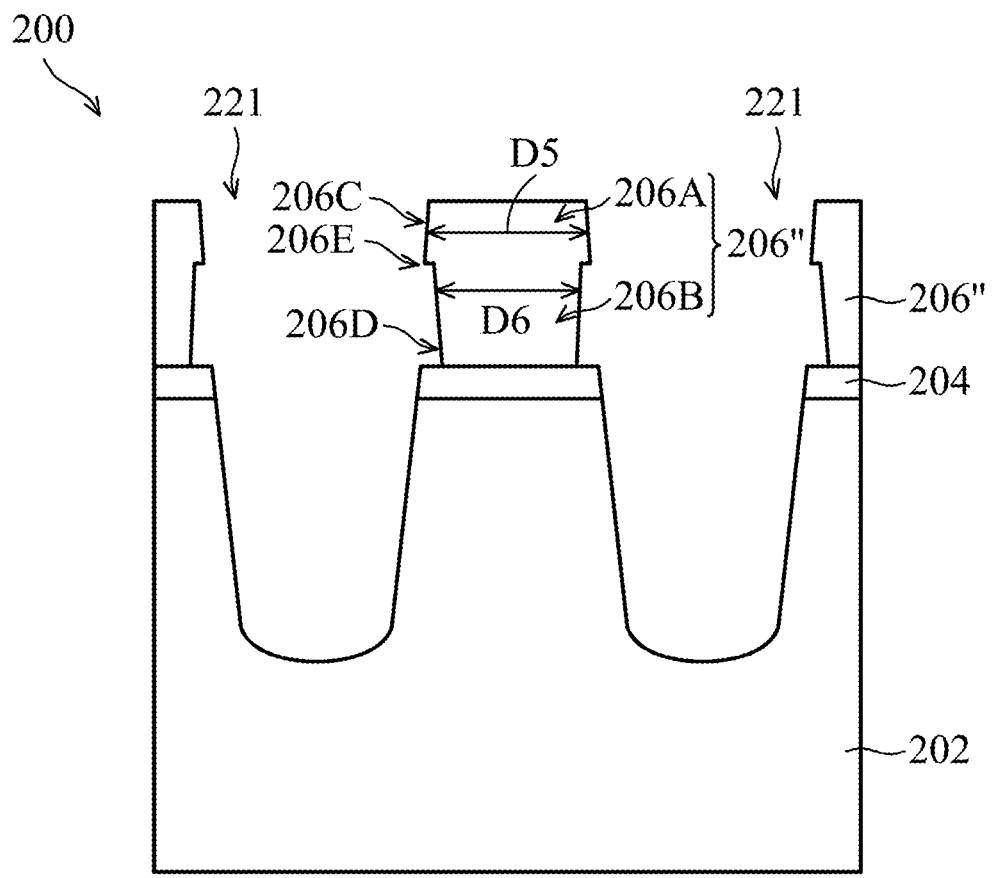

An etching process 2100 is performed on the semiconductor structure 200 to trim the sacrificial patterns 206', as shown in FIG. 2D, in accordance with some embodiments. The lower portions of the sacrificial patterns 206' uncover by the protection layer 250 are laterally etched during the etching process 2100 so that the trenches 220 laterally expand at the sacrificial patterns 206', in accordance with some embodiments. The protection layer 250 protects the upper portions of the sacrificial patterns 206' from being etched away, in accordance with some embodiments. The trimmed sacrificial patterns 206' are labeled as sacrificial patterns 206' and the expanded trenches 220 are labeled as trenches 221, in accordance with some embodiments. In some embodiments where the sacrificial patterns 206" is made of nitride, the etching process 2100 is a wet etching using hot phosphoric acid. In some embodiments, the etching process 2100 does not remove or merely removes a small amount of the materials the gate dielectric layer 204 and the semiconductor substrate 202. After the etching process 2100, the protection layer 250 is removed using an ash process, in accordance with some embodiments.

FIG. 2D-1 is a portion of the cross-sectional view of FIG. 2D to illustrate additional details in accordance with some embodiments of the present disclosure. In some embodiments, the trimmed sacrificial pattern 206" has a T-shaped profile. In some embodiments, the trimmed sacrificial pattern 206" includes an upper portion 206A and a lower portion 206B. In some embodiments, a width D5 the upper portion 206A is greater than a width D6 of the lower portion 206B. In some embodiments, the upper portion 206A has a sidewall 206C and the lower portion 206B has a sidewall 206D at a side of the sacrificial pattern 206". In some embodiments, the sidewall 206C and the sidewall 206D are not a continuous surface and the sidewall 206C is connected to the sidewall 206D though a connection wall 206E which extends in a direction that is parallel to the main surface of the semiconductor substrate 202. In some embodiments, the uppers surface of the gate dielectric layer 204 does not entirely cover by the lower portion 206B of the sacrificial patterns 206".

Figure 2E:
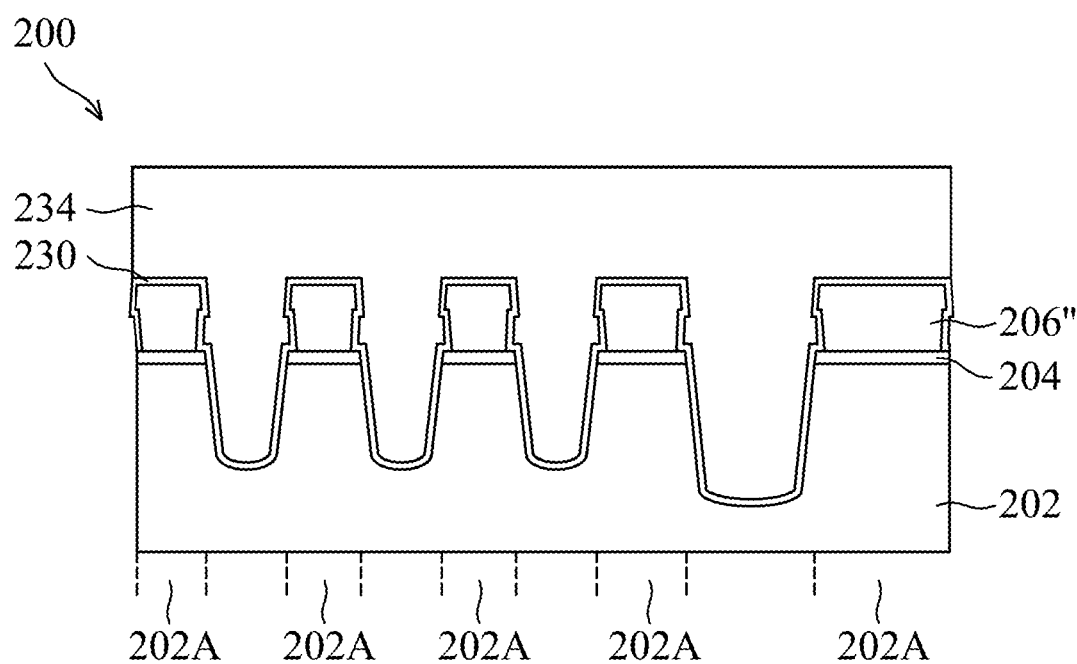

A lining layer 230 is conformally formed over the semiconductor structure 200, as shown in FIG. 2E, in accordance with some embodiments. The lining layer 230 is configured to restore the surfaces which are damaged by the etching processes so that the resulting semiconductor device may have lower leak current and to advantageously adhere an insulating material subsequently formed in the trenches to the active regions 202A of the semiconductor substrate 202, in accordance with some embodiments. The lining layer 230 extends conformally along and covers the sidewalls (i.e., the sidewalls of the sacrificial patterns 206", the upper surface and the sidewalls of the gate dielectric layer 204, and the sidewalls of the active regions 202A of the semiconductor substrate 202) and the bottom surface of the trenches 221, in accordance with some embodiments. The lining layer 230 also extends along and covers the upper surfaces of the sacrificial patterns 206", in accordance with some embodiments. In some embodiments, the material and the formation method of the lining layer 230 are the same as or similar to the first lining layer 130.

A first insulating material 234 is formed over the lining layer 230, as shown in FIG. 2E, in accordance with some embodiments. The first insulating material 234 is filled in a remainder of the trenches 221 and formed over the top surface of the lining layer 230, in accordance with some embodiments. In some embodiments, the first insulating material 234 and formation thereof method are the same as or similar to the first insulating material 134.

Portions of the first insulating material 234 and the lining layer 230 over the upper surfaces of the sacrificial patterns 206' are removed using such as CMP until the sacrificial patterns 206" are exposed, in accordance with some embodiments. In some embodiments, the sacrificial patterns 206" are configured as the polishing stop layer for the removal process.

Figure 2F:
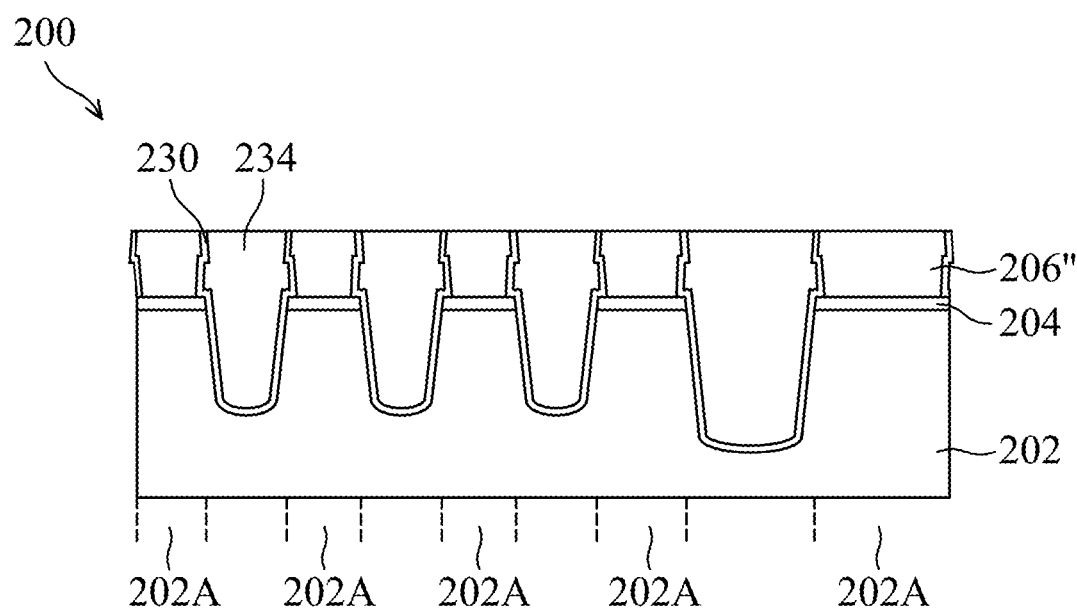
Figure 2G:
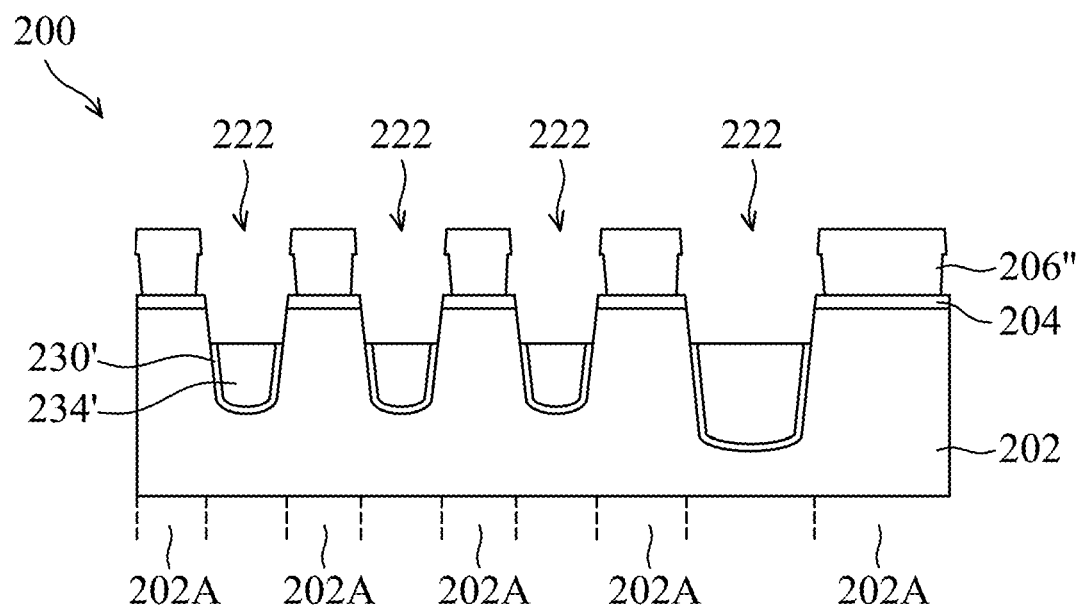

The first insulating material 234 and the lining layer 230 are recessed to form trenches 222, as shown in FIG. 2F, in accordance with some embodiments. The recessed first insulating material 234 and the recessed lining layer 230 are labeled as a first insulating material 234' and a lining layer 230' respectively, in accordance with some embodiments. In some embodiments, the trenches 222 expose the sacrificial patterns 206", the gate dielectric layer 204 and the active regions 202A of the semiconductor structure 202.

Figure 2H:
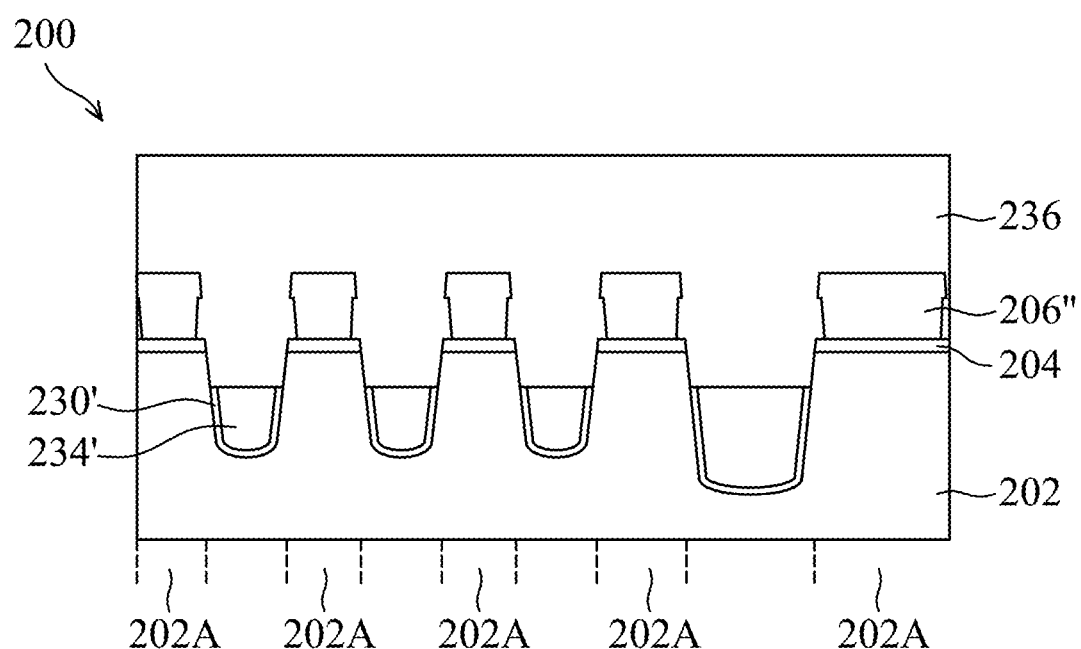

A second insulating material 236 is formed to fill the trenches 222, as shown in FIG. 2H, in accordance with some embodiments. The second insulating material 236 covers the upper surfaces of the sacrificial patterns 206", in accordance with some embodiments. In some embodiments, the second insulating material 236 and the formation method thereof are the same as or similar to the second insulating material 136.

Figure 2I:
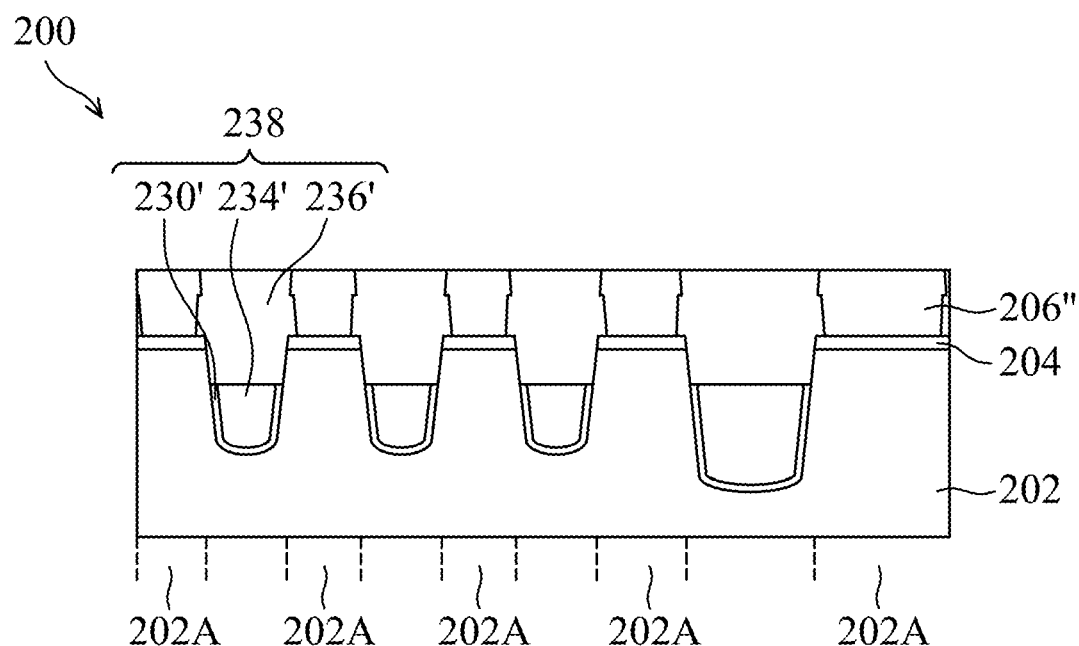

In some embodiments, a portion of the second insulating material 236 over the upper surfaces of the sacrificial patterns 206" is removed using such as CMP until the upper surfaces of the sacrificial patterns 206" are exposed, as shown in FIG. 2I, in accordance with some embodiments. In some embodiments, the sacrificial patterns 206" are configured as the polishing stop layer for the removal process. The second insulating material 236 after being polished is labeled as a second insulating material 236', in accordance with some embodiments. The lining layer 230', the first insulating material 234' and the second insulating material 236' combine to form an isolation structure 238, in accordance with some embodiments.

Figure 2J:
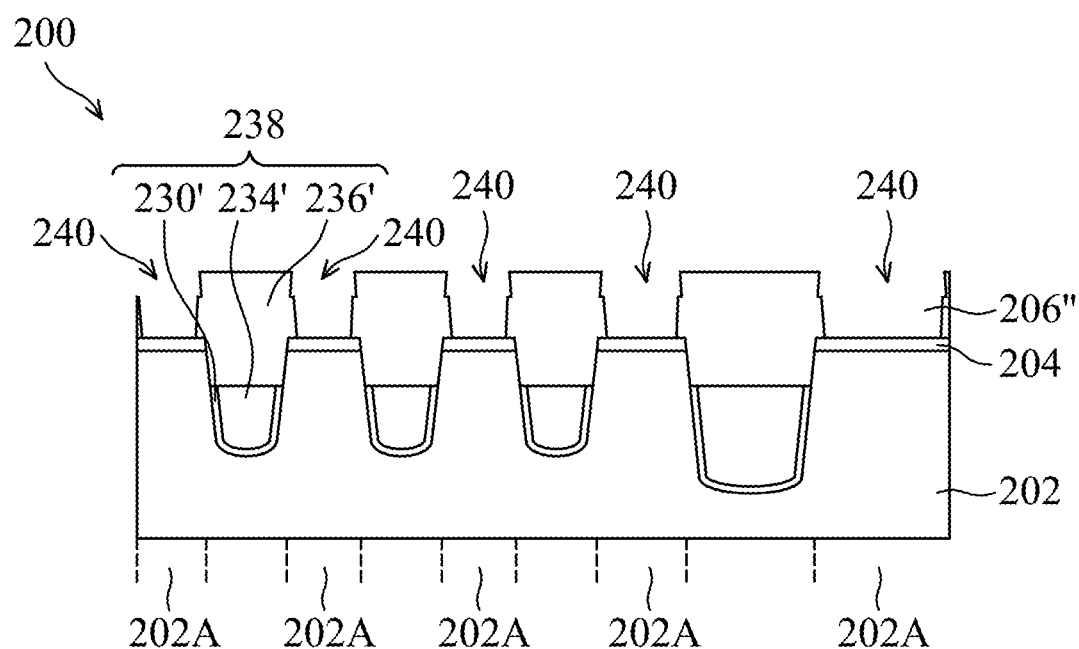

The sacrificial patterns 206" are replaced with gate electrodes, in accordance with some embodiments. The replacement process includes removing the sacrificial patterns 206" to form openings 240, as shown in FIG. 2J, in accordance with some embodiments. The openings 240 expose the gate dielectric layer 204 and the second insulating layer 236' of the isolation structure 238, in accordance with some embodiments. In some embodiments where the sacrificial patterns 206" are made of nitride, the removal process includes wet etching using hot phosphoric acid. The opening 240 formed by the removal process has a T-shaped profile, in accordance with some embodiments. A width of an upper portion of the opening 240 is greater than a width of a lower portion of the opening 240, in accordance with some embodiments.

Figure 2K:
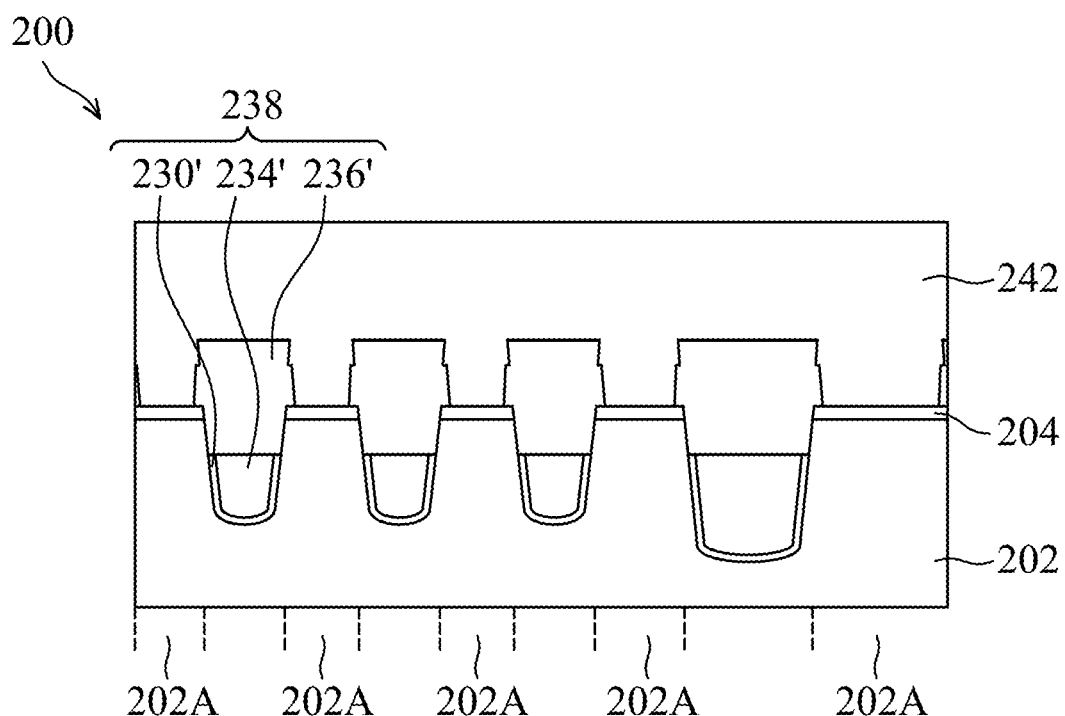

The replacement process includes forming a conductive material 242 over the semiconductor structure 200, as shown in FIG. 2K, in accordance with some embodiments. The conductive material 242 fills the openings 240 and covers the upper surface of the isolation structure 238, in accordance with some embodiments. In some embodiments, the conductive material 242 and the formation method thereof are the same as or similar to the conductive material 142.

Because the width of an upper portion of the opening 240 is greater than the width of a lower portion of the opening 240, the likelihood of the formation of a void inside the conductive material 242 in the openings 240 may be reduced during filling the conductive material 242 into the openings 240. Therefore, the reliability and the manufacturing yield of the resulting semiconductor device may be increased.

Figure 2L:
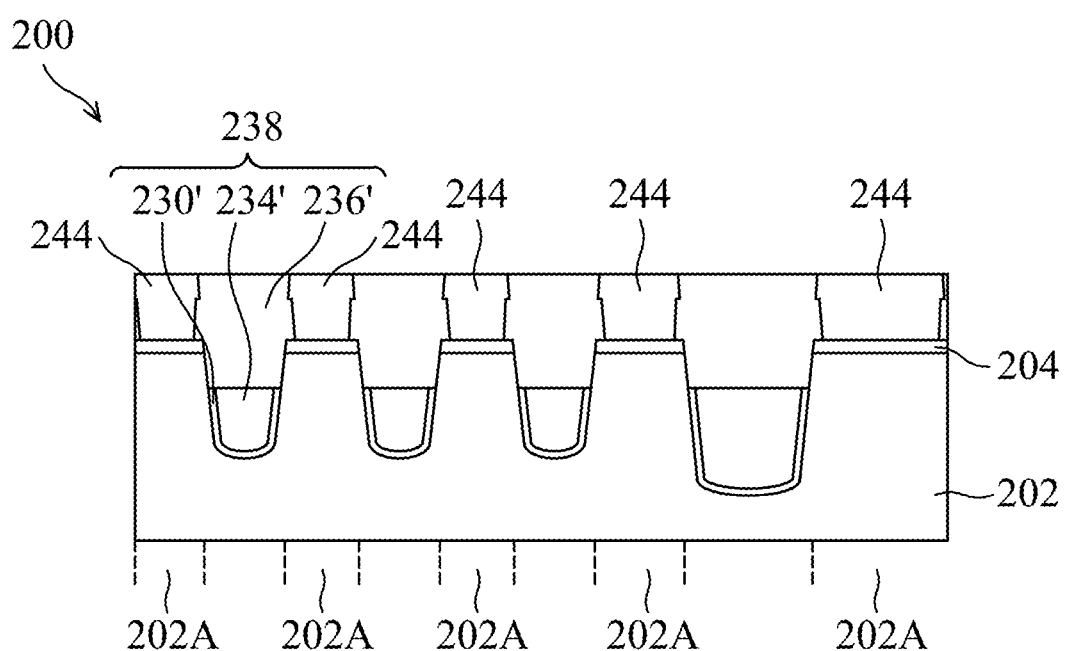
Figures 1, 2L:
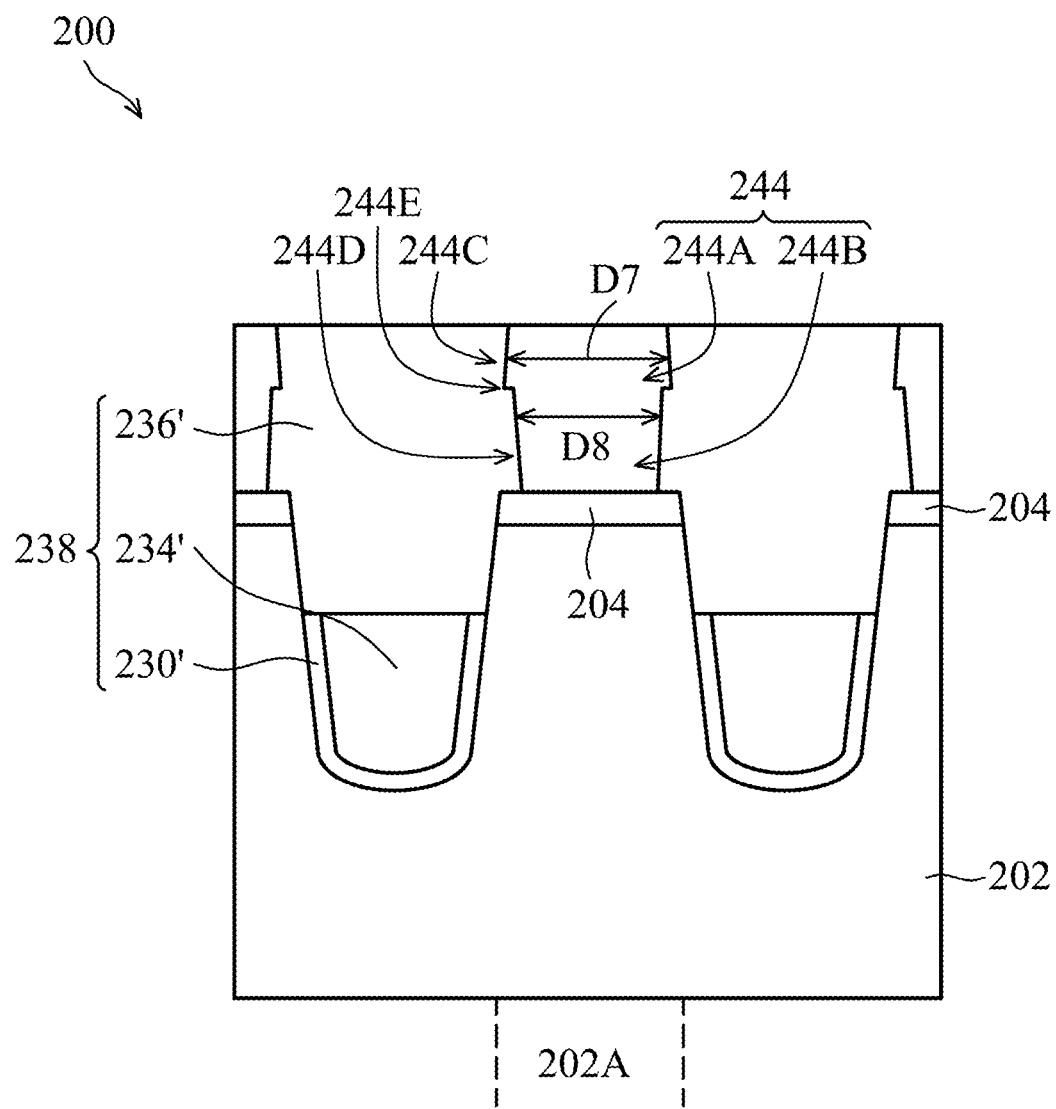

The replacement process includes removing the portion of the conductive material 242 over the upper surface of the isolation structure 238 until the upper surface of the isolation structure 238 is exposed, as shown in FIG. 2L, in accordance with some embodiments. In some embodiments, the removal process is a CMP process. Remaining portions of the conductive material 242 in the openings 240 serve as the gate electrodes 244, in accordance with some embodiments. In some embodiments, the gate electrode 244 and the gate dielectric layer 204 combine to form a gate structure of a semiconductor device which engages a channel region in the active region 202A of the semiconductor substrate 202.

FIG. 2L-1 is a portion of the cross-sectional view of FIG. 2L to illustrate additional details in accordance with some embodiments of the present disclosure. In some embodiments, the gate electrode 244 has a T-shaped profile. In some embodiments, the gate electrode 244 has an upper portion 244A and a lower portion 244B. In some embodiments, a width D7 of the upper portion 244A is greater than a width D8 of the lower portion 244B. In some embodiments, the upper portion 244A has a sidewall 244C and the lower portion 244B has a sidewall 244D at a side of the gate electrode 244. In some embodiments, the sidewall 244C is offset from the sidewall 244D toward the isolation structure 238 so that the sidewall 244C and the sidewall 244D are not a continuous surface. In some embodiments, the sidewall 244C is connected to the sidewall 244D though a connection wall 244E which extends in a direction that is parallel to the main surface of the semiconductor substrate 202. In some embodiments, the gate electrode 244 partially covers the upper surface of the gate dielectric layer 204.

The gate structure (including the gate electrode 244 and the gate dielectric layer 204) and the active region 202A of the semiconductor substrate 202 are embedded in the isolation structure 238, in accordance with some embodiments. In some embodiments, the second insulating material 236' of the isolation structure 238 is in direct contact with the gate electrode 244, the gate dielectric layer 204 and an upper portion of the active region 202A, in accordance with some embodiments. The second insulating material 236' of the isolation structure 238 partially covers the upper surface of the gate dielectric layer 204, in accordance with some embodiments. The lining layer 230' of the isolation structure 238 lines on a lower portion of the sidewall of the active region 202A of the semiconductor substrate 202 and surrounds the first insulating material 234' of the isolation structure 238, in accordance with some embodiments.

In some embodiments, additional components may be formed over the semiconductor structure 200 to produce a semiconductor memory such as flash memory. In some embodiments, the gate electrode 244 may serve as the floating gate of flash memory.

Figure 3:
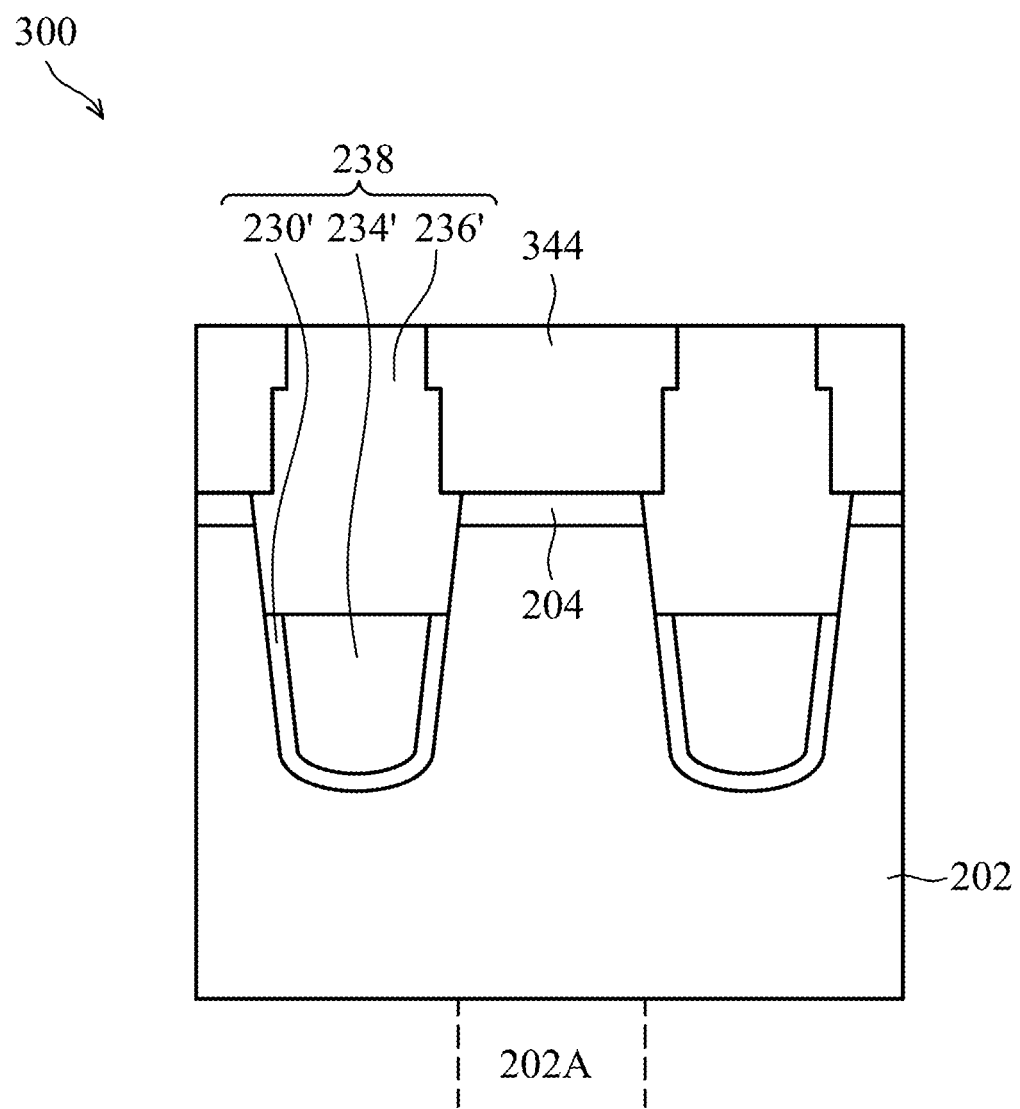
FIG. 3 is a modification of the cross-sectional view of FIG. 2L-1 in accordance with some embodiments of the present disclosure.

FIG. 3 is a modification of the cross-sectional view of FIG. 2L-1 in accordance with some embodiments of the present disclosure. While the sacrificial patterns 206' (FIG. 2J) are being etched away, the etchant may over-etch the second insulating material 236' of the insulating structure 238, in accordance with some embodiments. As a result, a semiconductor structure 300 shown in FIG. 3 may have a gate electrode 344 with a larger dimension (such as width) than the gate electrode 244 of the semiconductor structure 200. A width of the bottom surface of the gate electrode 344 is greater than a width of the top surface of the active region 202A of the semiconductor substrate 202, in accordance with some embodiments. The gate electrode 344 entirely covers the gate dielectric layer 204, in accordance with some embodiments.

As described above, the embodiments of the present disclosure provide a method for forming a semiconductor structure. Due to the trimming processes described above (e.g., the step 1030 of the etching process 1000 or the etching process 2100), the sacrificial pattern 106"/206" is formed to have its upper portion with a wider width than its lower portion. As a result, the likelihood of the formation of a void inside the conductive material for the gate electrode may be reduced during replacing the sacrificial pattern with the gate electrode. Therefore, the reliability and the manufacturing yield of the resulting semiconductor device may be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a semiconductor substrate having a trench and an active region, wherein the trench defines the active region;
a gate electrode disposed over the active region, wherein the gate electrode comprises an upper portion and a lower portion and a width of the upper portion is greater than a width of the lower portion, wherein the upper portion has a first sidewall at a first side of the gate electrode and the lower portion has a second sidewall at the first side, and wherein an angle between the second sidewall and a bottom surface of the gate electrode is an obtuse angle; and
an isolation structure, wherein the active region and the gate electrode are embedded in the isolation structure, and the isolation structure comprises:
a first insulating material, wherein the first insulating material is a spin-on-glass, the first insulating material has a top surface below a top surface of the active region, and the first insulating material fully fills a lower portion of the trench; and
a second insulating material disposed over the first insulating material,
wherein a shape of a sidewall of the isolation structure and a shape of an entire sidewall of the gate electrode are complementary,
wherein a top surface of the isolation structure and a top surface of the gate electrode are leveled,
wherein the gate electrode has a T-shaped profile, and
wherein a width of the bottom surface of the gate electrode is greater than a width of the top surface of the active region.

2. The semiconductor structure as claimed in claim 1, wherein the first sidewall and the second sidewall are not a continuous surface, and the width of the lower portion of the gate electrode is smaller than a width of the top surface of the active region.

3. The semiconductor structure as claimed in claim 2, wherein the first sidewall is connected to the second sidewall through a connection wall and the connection wall extends in a direction parallel to a main surface of the semiconductor substrate.

4. The semiconductor structure as claimed in claim 1, wherein the isolation structure further comprises:
a first lining layer disposed between the first insulating material and the active region of the substrate, wherein the first lining layer lines on a lower portion of a sidewall of the active region of the semiconductor substrate and surrounds the first insulating material of the isolation structure, and the second insulating material covers the first lining layer and the first insulating material.

5. The semiconductor structure as claimed in claim 4, wherein the gate electrode is in direct contact with the second insulating material.

6. The semiconductor structure as claimed in claim 1, further comprising:
a gate dielectric layer between the active region and the gate electrode, wherein the second insulating material of the isolation structure partially covers an upper surface of the gate dielectric layer.

7. The semiconductor structure as claimed in claim 1, further comprising:
a gate dielectric layer between the active region and the gate electrode, wherein both sides of the gate dielectric layer directly contact the second insulating material.

8. The semiconductor structure as claimed in claim 1, wherein the first sidewall is offset from the second sidewall toward the isolation structure.

9. The semiconductor structure as claimed in claim 1, further comprising:
a gate dielectric layer between the active region and the gate electrode, wherein the gate electrode entirely covers the gate dielectric layer.

10. The semiconductor structure as claimed in claim 1, wherein the second insulating material directly contacts the gate electrode.

11. A semiconductor structure, comprising:
a semiconductor substrate having a trench and an active region, wherein the trench defines the active region;
a gate electrode disposed over the active region, wherein the gate electrode comprises an upper portion and a lower portion and a width of the upper portion is greater than a width of the lower portion, wherein the upper portion has a first sidewall at a first side of the gate electrode and the lower portion has a second sidewall at the first side, and wherein an angle between the second sidewall and a bottom surface of the gate electrode is an obtuse angle; and
an isolation structure, wherein the active region and the gate electrode are embedded in the isolation structure, and the isolation structure comprises:

a first insulating material, wherein the first insulating material is a spin-on-glass, the first insulating material has a top surface below a top surface of the active region, and the first insulating material fully fills a lower portion of the trench; and a second insulating material disposed over the first insulating material, wherein the isolation structure further comprises:

a first lining layer disposed between the first insulating material and the active region of the substrate; and a second lining layer disposed between the first lining layer and the first insulating material, wherein the first lining layer and the second lining layer are disposed between the second insulating material and the gate electrode, wherein the first lining layer and the second lining layer line on an entire sidewall of the gate electrode.

12. The semiconductor structure as claimed in claim 11, wherein the first lining layer is an oxide layer and the second lining layer is a nitride layer.

13. The semiconductor structure as claimed in claim 11, wherein the gate electrode has a trapezoidal profile.

14. The semiconductor structure as claimed in claim 11, wherein the first lining layer and the second lining layer surround the first insulating material and the second insulating material.

15. The semiconductor structure as claimed in claim 11, wherein the second insulating material is spaced apart from the gate electrode by the first lining layer and the second lining layer.

16. The semiconductor structure as claimed in claim 11, further comprising:

a gate dielectric layer between the active region and the gate electrode, wherein the second insulating material is spaced apart from the gate dielectric layer by the first lining layer and the second lining layer.

17. The semiconductor structure as claimed in claim 11, further comprising:

a gate dielectric layer between the active region and the gate electrode, wherein the second insulating material has a bottom surface below a bottom surface of the gate dielectric layer.

18. The semiconductor structure as claimed in claim 11, wherein a top surface of the second insulating material, a top surface of the first lining layer, a top surface of the second lining layer, and a top surface of the gate electrode are level.

\* \* \* \* \*